(12) United States Patent
Tanaka

(10) Patent No.: US 8,227,329 B2
(45) Date of Patent: Jul. 24, 2012

(54) SEMICONDUCTOR DEVICE AND METHOD FOR MANUFACTURING THE SAME

(75) Inventor: Takuji Tanaka, Tachikawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/305,054

(22) Filed: Nov. 28, 2011

(65) Prior Publication Data

US 2012/0070969 A1 Mar. 22, 2012

Related U.S. Application Data

(62) Division of application No. 12/641,403, filed on Dec. 18, 2009, now Pat. No. 8,084,341, which is a division of application No. 11/398,651, filed on Apr. 6, 2006, now Pat. No. 7,659,188.

(30) Foreign Application Priority Data

Sep. 5, 2005 (JP) ................................. 2005-257054
Nov. 24, 2005 (JP) ................................. 2005-339386

(51) Int. Cl.
*H01L 21/00* (2006.01)
(52) U.S. Cl. ........................ 438/527; 438/529
(58) Field of Classification Search ........... 438/527–529
See application file for complete search history.

(56) References Cited

U.S. PATENT DOCUMENTS

| 4,920,065 | A | 4/1990 | Chin et al. |
| 5,155,061 | A | 10/1992 | O'Connor et al. |
| 7,659,188 | B2 * | 2/2010 | Tanaka .......................... 438/527 |
| 8,084,341 | B2 * | 12/2011 | Tanaka .......................... 438/527 |
| 2006/0189082 | A1 | 8/2006 | Vogelsang |

FOREIGN PATENT DOCUMENTS

JP 10-199993 A 7/1998
JP 2003-347541 A 12/2003

* cited by examiner

*Primary Examiner* — Richard A. Booth
(74) *Attorney, Agent, or Firm* — Westerman, Hattori, Daniels & Adrian, LLP

(57) ABSTRACT

A method for manufacturing a semiconductor device includes steps of preparing a semiconductor substrate having a first conductive type; implanting a first impurity having the first conductive type in the semiconductor substrate to form a well region having a bottom portion; and implanting a second impurity having a second conductive type in the semiconductor substrate to form an impurity region having a top portion, the top of the impurity region being in contact with the bottom portion of the well region. Implantation of the second impurity includes a first step of implanting the second impurity and a second step of implanting the second impurity, wherein a first implantation area of the first step of implanting the second impurity being broader or narrower than a second implantation area of the second step of implanting the second impurity.

1 Claim, 16 Drawing Sheets

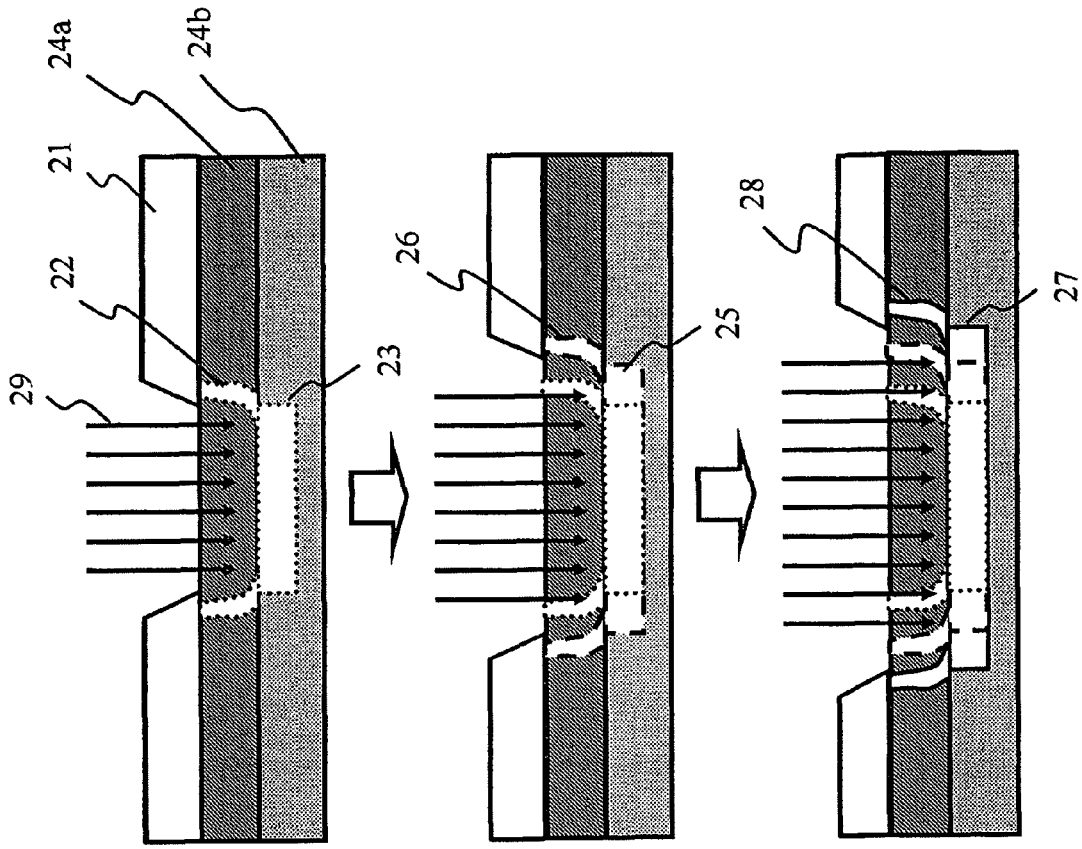

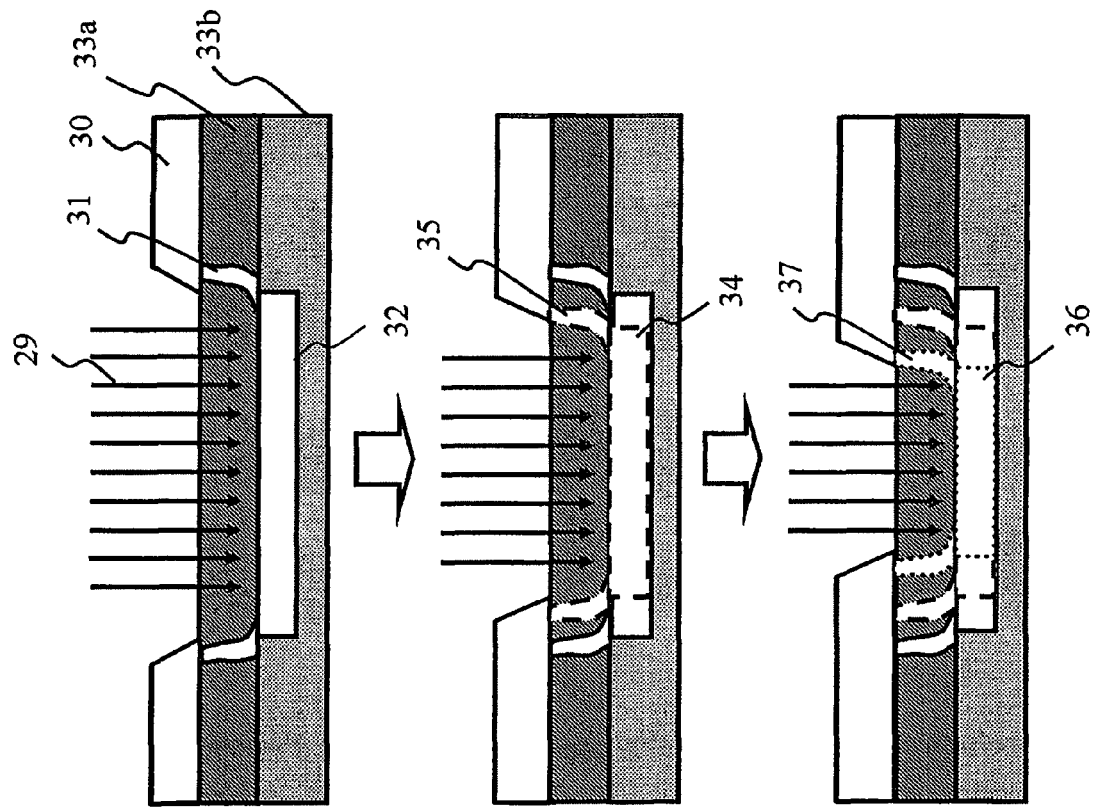

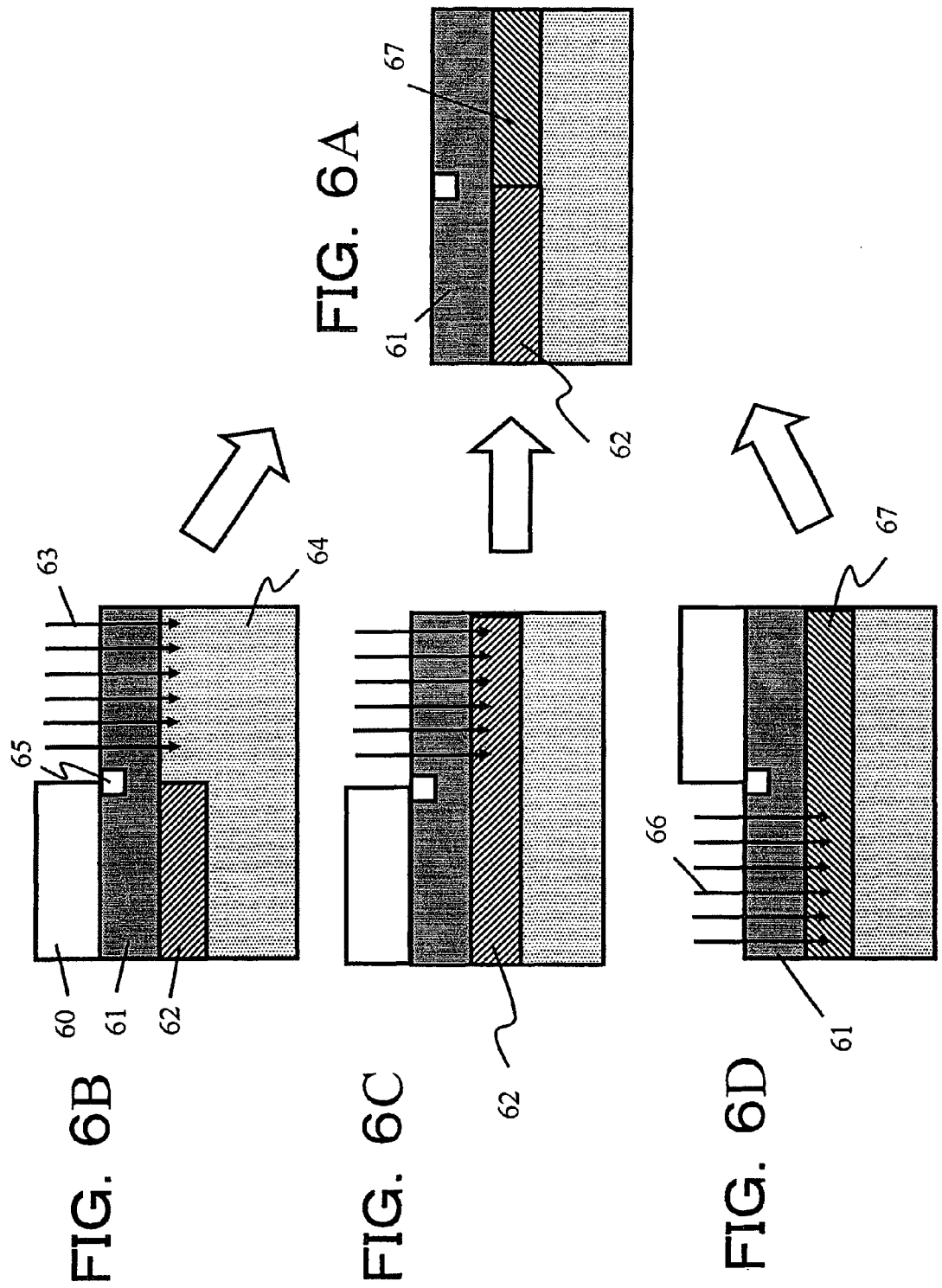

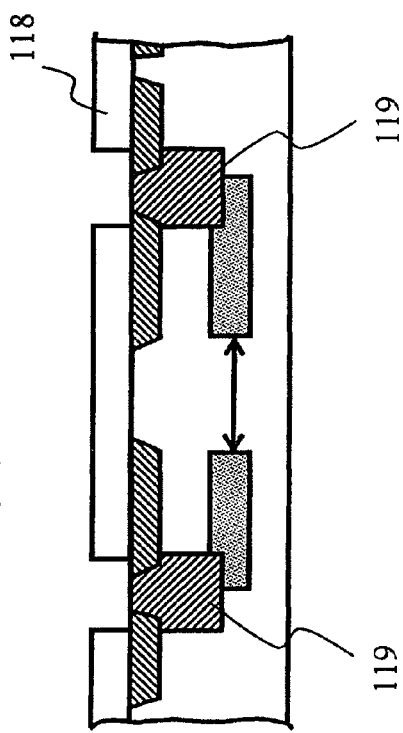
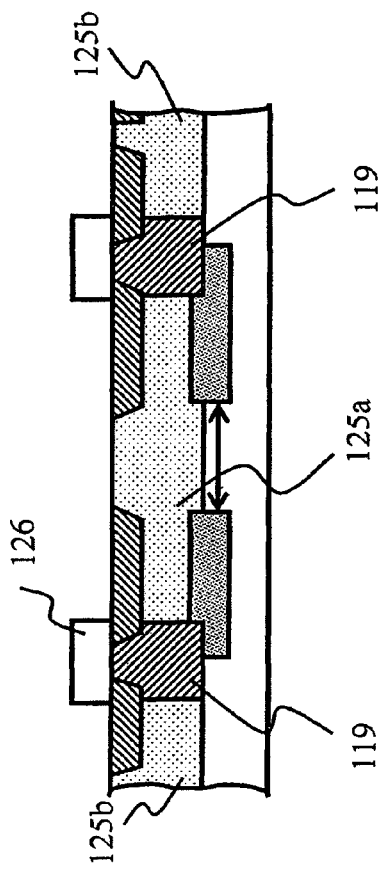
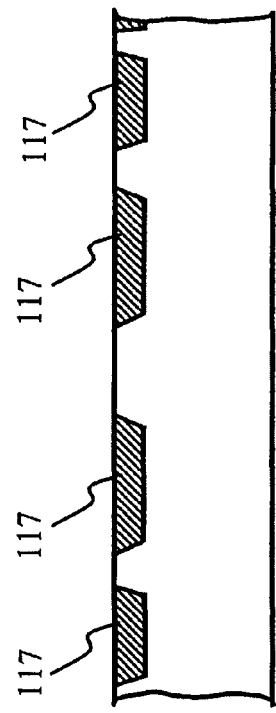
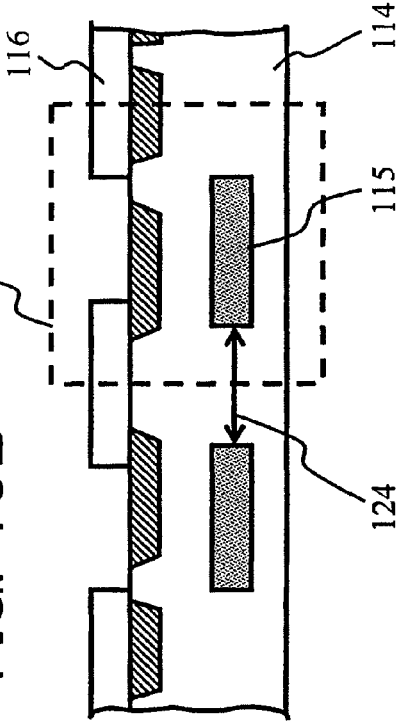

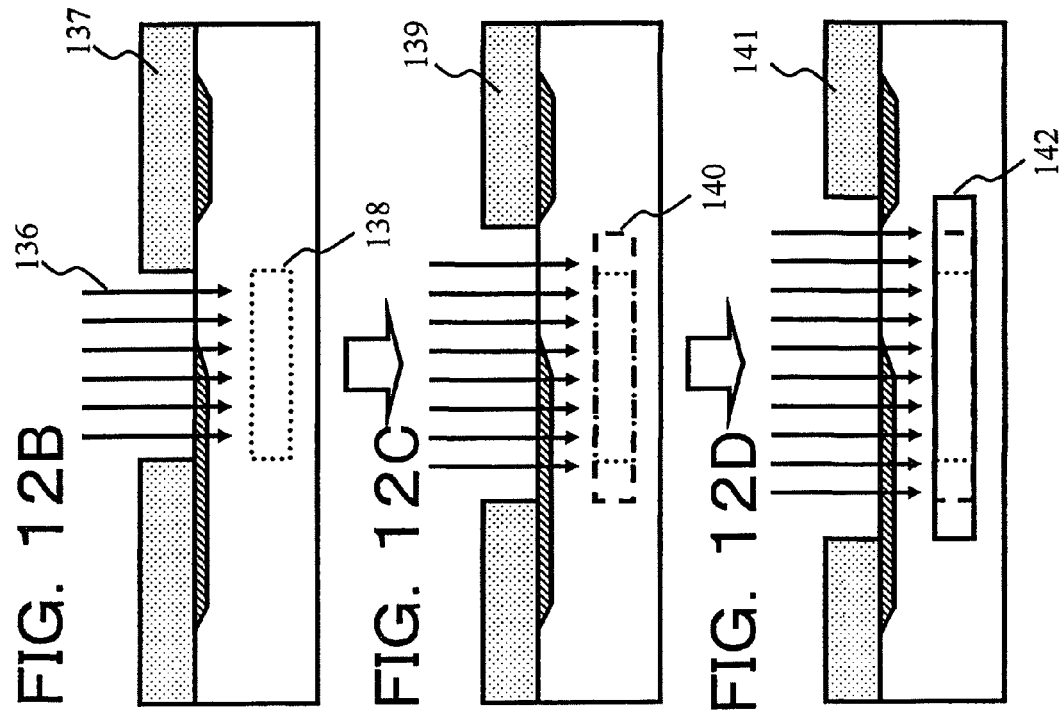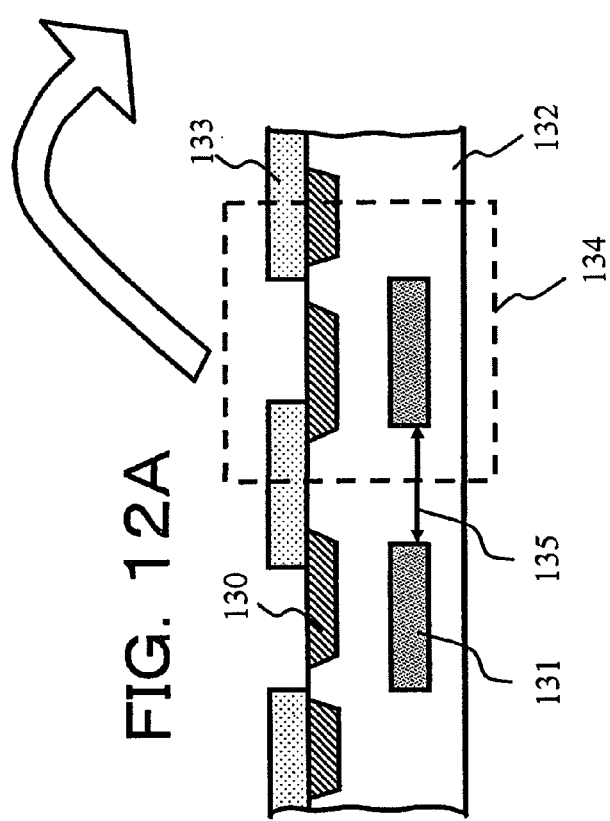

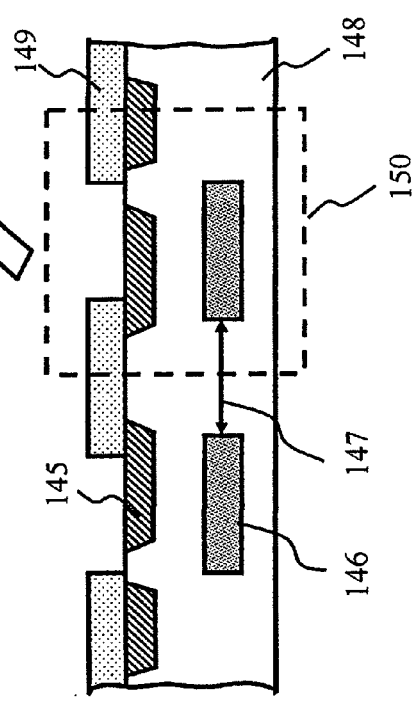
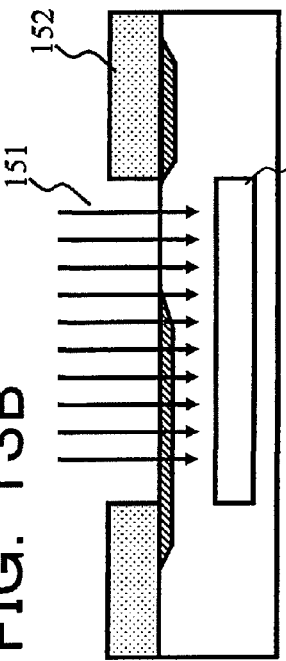
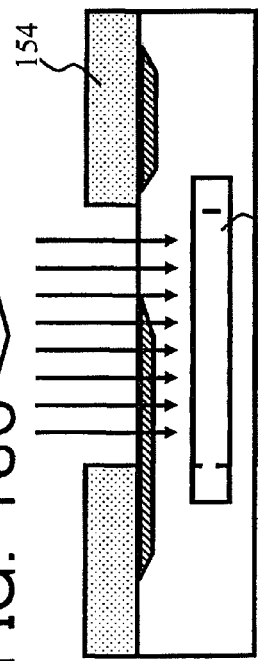
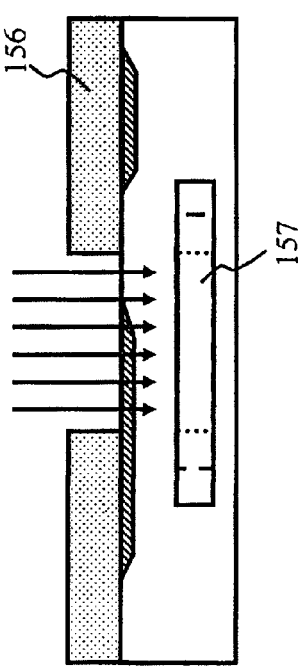

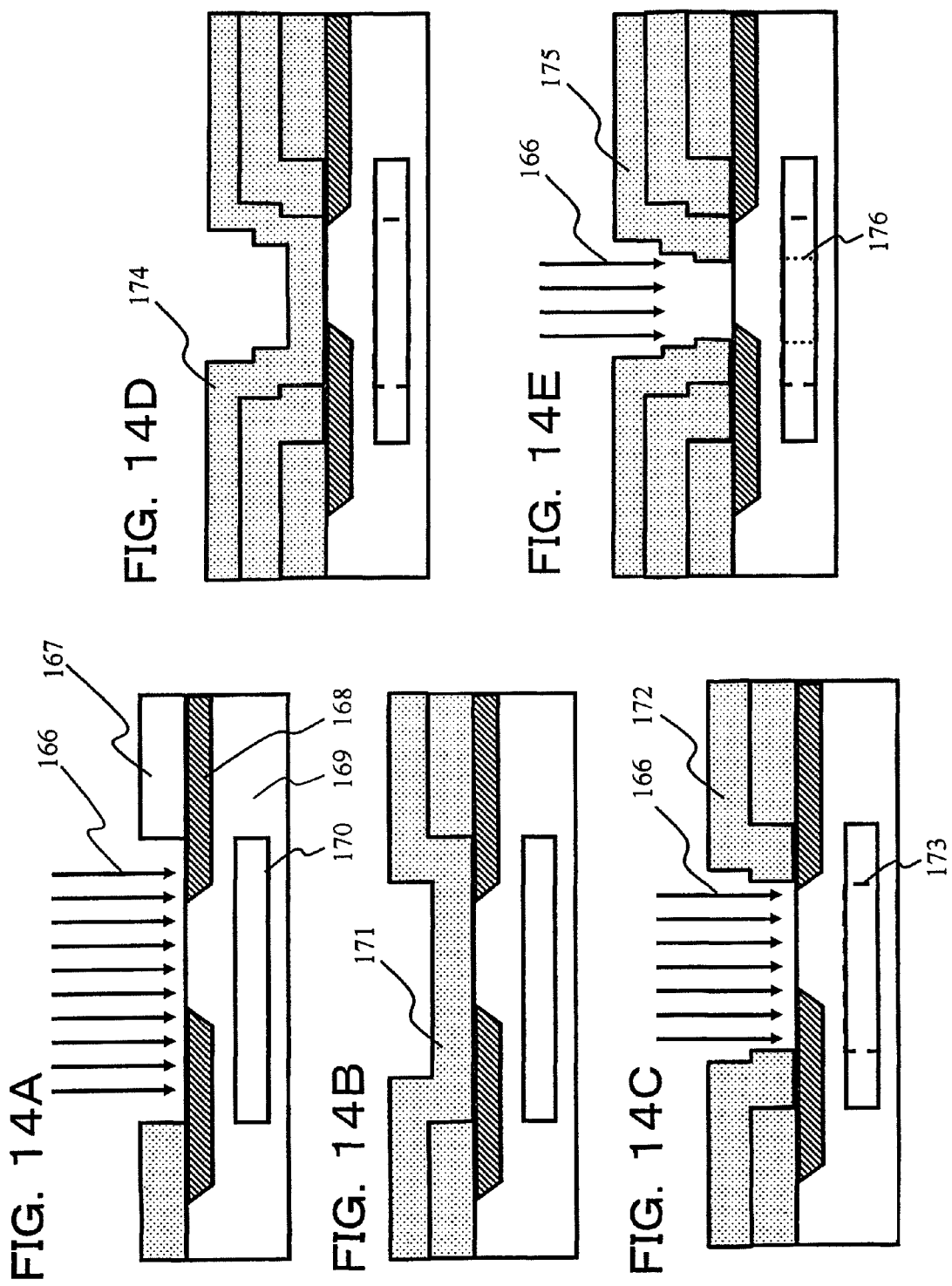

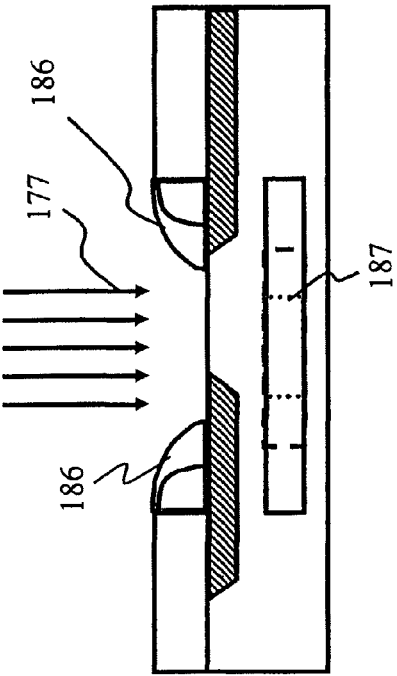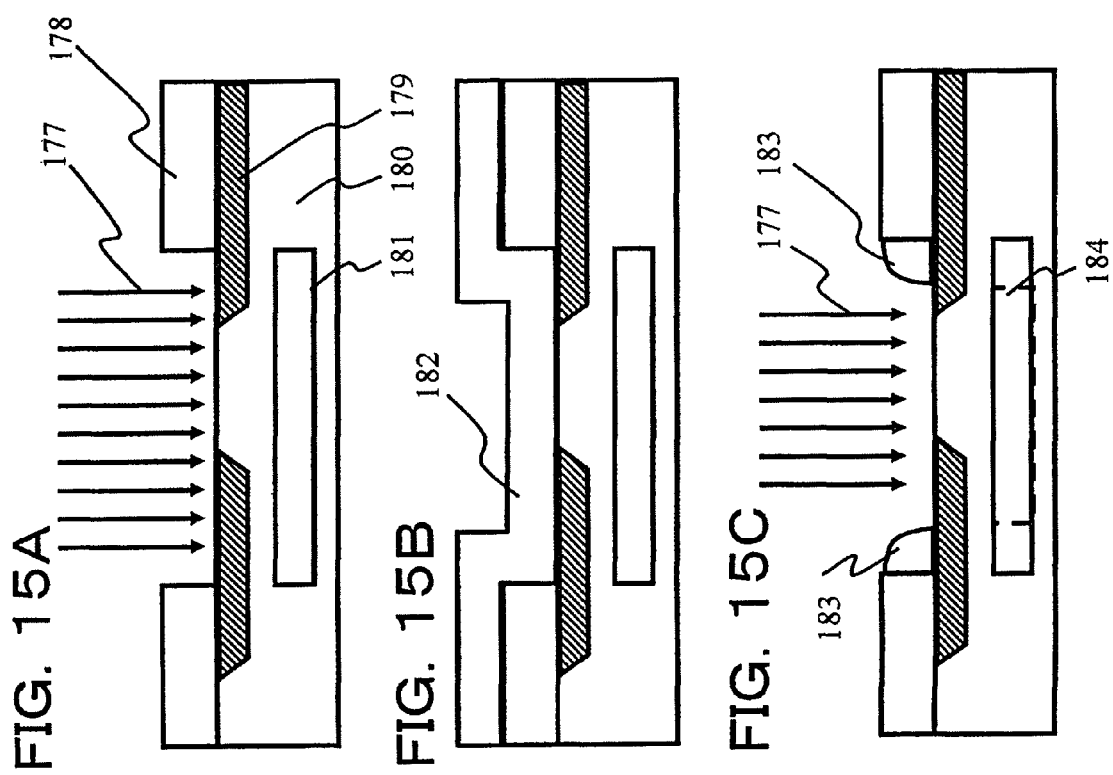

SEMICONDUCTOR DEVICE AND METHOD FOR MANUFACTURING THE SAME

CROSS REFERENCE TO RELATED APPLICATIONS

This application is a divisional application of U.S. Ser. No. 12/641,403 filed Dec. 18, 2009, which is a divisional application of U.S. Ser. No. 11/398,651 filed Apr. 6, 2006, now U.S. Pat. No. 7,659,188, which is based upon and claims the benefit of priority from Japanese Patent Application No. 2005-257054 filed Sep. 5, 2005, and Japanese Patent Application No. 2005-339386 filed Nov. 24, 2005, the entire contents of which being incorporated herein by reference.

BACKGROUND OF THE INVENTION

1. Field of the Invention

The present invention relates to a method for manufacturing a semiconductor device, and more particularly, relates to a method for manufacturing a semiconductor device in which variation in properties of an element is suppressed which is formed in the vicinity of a semiconductor surface and also in a boundary area of an impurity region formed in a semiconductor substrate at a place apart from the surface thereof.

2. Description of the Related Art

In recent years, high-energy ion implantation has been practically used; hence, by impurity ion implantation in combination with short period heat treatment, an impurity region can be formed in a semiconductor substrate at a place apart from a surface thereof.

For example, in a semiconductor device incorporating a large scale integration (LSI) circuit, when a triple well structure is employed in which a P-type well region is surrounded by an N-type well region, an N-type impurity region, which is located at a place deeper than the bottom portion of the P-type well region and which forms a part of the N-type well region, is formed by high-energy ion implantation.

In addition, when impurity implantation by high-energy ion implantation is masked with a resist, a penetrating region which electrically connects the P-type well region and the semiconductor substrate is provided so as to penetrate the N-type impurity region forming a part of the N-type well region.

As a result, while effects of preventing noise generated from the semiconductor substrate and injection of minor carrier current in the semiconductor substrate are maintained, a predetermined potential level is applied to the P-type well region from the semiconductor substrate (for example, see Japanese Unexamined Patent Application Publication No. 10-199993)

However, it has been difficult to form an edge shape of a resist which is strictly perpendicular to the surface of the semiconductor substrate, the resist being used for masking high-energy impurity ion implantation. That is, in a boundary area of a region in which impurity ion implantation is to be masked, when being observed, the end portion of the resist mask is inclined with respect to the normal line to the surface of the semiconductor substrate. Hence, an impurity implanted in a thin portion of the resist passes therethrough, the thin portion being formed since the end portion of the resist mask has an inclined shape. As a result, since implantation energy of the impurity passing through the thin portion of the resist is decreased, the impurity does no reach a predetermined depth and stays in a region close to the surface of the semiconductor substrate.

Hence, in the boundary area of the region in which the high-energy impurity ion implantation is to be masked, the implanted impurity does not reach a predetermined depth, that is, the impurity stays in the region close to the surface of the semiconductor substrate; however, the above phenomenon is not expected beforehand, and a problem may arise in that a preferable predetermined impurity distribution cannot be obtained. As a result, when a semiconductor element is formed in the boundary area of the region in which the high-energy impurity ion implantation is to be masked, a problem may arise in that predetermined operation of the semiconductor element is adversely influenced. For example, when the semiconductor element is a MOS(Metal Oxide Semiconductor) transistor, in the vicinity of the impurity region of a drain or a source, a problem may arise in that a leakage current from a source electrode or a drain electrode is increased due to decrease in P-N junction withstand voltage.

Accordingly, in order to compensate for the impurity staying in the region close to the surface of the semiconductor substrate, it has been proposed that an impurity having a conductive type opposite to that of the above impurity is implanted in the region close to the surface of the semiconductor substrate (for example, see Japanese Unexamined Patent Application Publication No. 2000-124452).

However, it has been difficult to implant the impurity for compensation only in the boundary area of the region in which the high-energy impurity ion implantation is to be masked. That is, the impurity used for compensation is also inevitably implanted in a region other than the boundary area.

Hence, in a region in which the impurity to be compensated for is not present, the concentration of the impurity used for compensation is increased, and as a result, a problem may arise in that a predetermined impurity distribution cannot be obtained.

In addition, in the boundary area of the region in which the high-energy impurity ion implantation is to be masked, in the case in which a conductive type of a region close to the surface of the semiconductor substrate is the same as that of the impurity implanted by high-energy ion implantation, when the impurity used for compensation is implanted in the region close to the surface of the semiconductor substrate, a problem may also arise in that the impurity in a region other than the boundary area is also compensated for.

SUMMARY OF THE INVENTION

The present invention relates to a semiconductor device and a method for manufacturing the same, and more particularly, relates to a semiconductor device and a method for manufacturing the same, the semiconductor device being capable of suppressing the variation in properties of an element formed in the vicinity of a surface of a semiconductor substrate and in a boundary area of an impurity region formed in the semiconductor substrate at a place apart from the surface thereof.

In addition, an object of the present invention is to provide a method for manufacturing a semiconductor device, which can solve problems of variation in element properties caused by an inclined shape of an end portion of a resist mask used for defining the above impurity region and, in addition, which can substantially maintain an impurity distribution in a region other than the boundary area of the region in which impurity ion implantation is to be masked.

The method for manufacturing a semiconductor device according to the present invention is a method for manufacturing a semiconductor device in which one optional impurity region is formed in a semiconductor substrate at a place apart from the surface thereof, and the method comprises the steps of implanting an impurity in the semiconductor substrate to form a well region, and in order to implant an impurity in a region which is in contact with the bottom portion of the above well region and which is to be formed into an impurity region, performing ion implantation for the above region a plurality of times while an ion implantation area on the surface of the semiconductor substrate is increased or decreased. According to the method described above, the problems described above are solved.

The semiconductor device of the present invention comprises a well region formed from the surface of the semiconductor substrate in the depth direction thereof, a semiconductor element disposed in the vicinity of the surface of the well region, a first impurity region formed from the bottom portion of the well region in the depth direction of the semiconductor substrate, and a second impurity region extending from the first impurity region in the width direction by a predetermined width. According to the semiconductor device of the present invention, the problems described above are solved.

BRIEF DESCRIPTION OF THE DRAWINGS

FIGS. 2A to 2C are views each showing a method for manufacturing a semiconductor device, according to Example 1;

FIGS. 3A to 3C are views, as those shown in FIGS. 2A to 2C, each showing a method for manufacturing a semiconductor device, according to Example 1;

FIGS. 6A to 6D are views, as those shown in FIGS. 5A to 5D, for illustrating a method for manufacturing a semiconductor device, according to Example 2;

FIGS. 10A to 10D are cross-sectional views for illustrating a first half of a process of a method for manufacturing a semiconductor device, according to Example 3;

FIGS. 12A to 12D are views for illustrating a method for implanting an N-type impurity, according to Example 3;

FIGS. 13A to 13D are views for illustrating another method for implanting an N-type impurity, according to Example 3;

FIGS. 14A to 14E are views for illustrating a method for implanting an impurity, according to Example 4;

FIGS. 15A to 15E are views for illustrating a modified method for implanting an impurity, according to Example 4.

DESCRIPTION OF THE PREFERRED EMBODIMENTS

Hereinafter, Example 1, Example 2, Example 3, Example 4, and Example 5 of the present invention will be described.

EXAMPLE 1

Example 1 is an example relating to a method for manufacturing a semiconductor device in which a P-type well region having a predetermined depth from a surface of a semiconductor substrate and an impurity region provided from the bottom portion of the above P-type well region in the depth direction of the semiconductor substrate are formed.

Figure 1A:
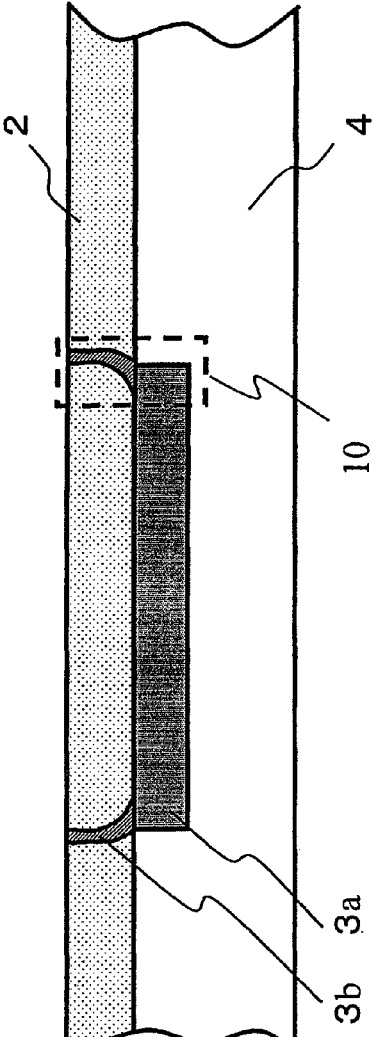
FIGS. 1A to 1C are views for illustrating in detail problems of a related method for manufacturing a semiconductor device.
Figure 1C:
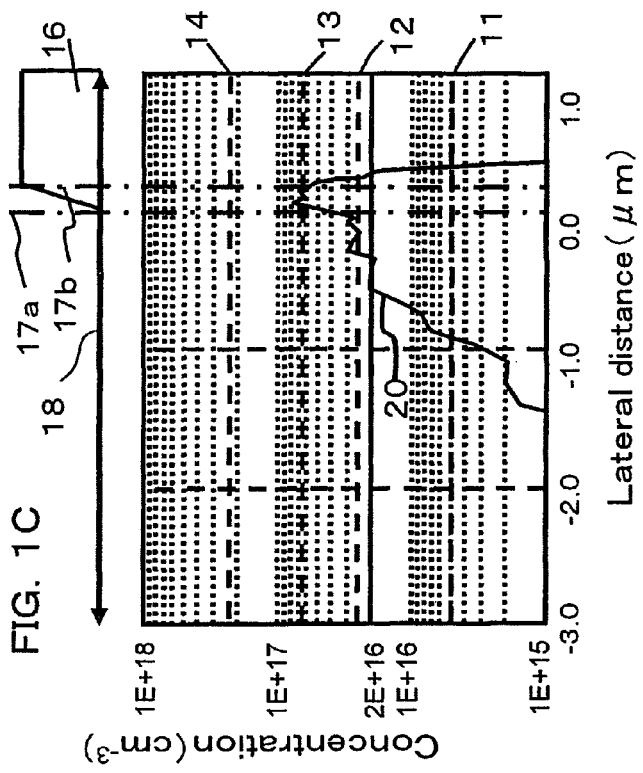
Figure 1B:
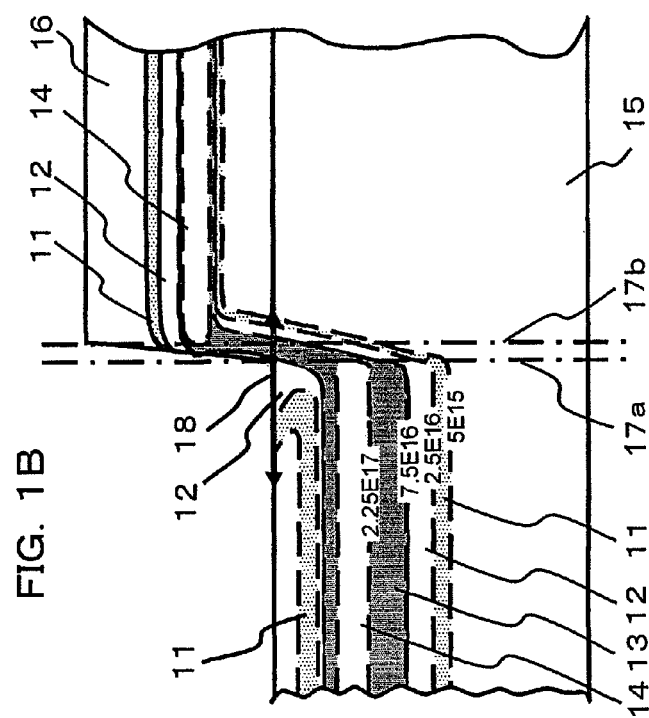

First, FIGS. 1A, 1B, and 1C are views for illustrating problems in detail of a related method for manufacturing a semiconductor device. In addition, FIG. 1A shows a P-type well region 2, an N-type well region 3a having a large doping depth, a region 3b which is implanted with an impurity passing through a resist, and a P-type semiconductor substrate 4, and a region 10 corresponding to that shown in FIG. 1B.

In addition, FIG. 1B shows a cross-sectional view of a semiconductor substrate 15 and a resist 16, and in the figure, there are shown isoconcentration lines 11, 12, 13, and 14 indicating concentrations of $5 \times 10^{15}/cm^3$, $2.5 \times 10^{16}/cm^3$, $7.5 \times 10^{16}/cm^3$, and $2.25 \times 10^{17}/cm^3$, respectively; dotted lines 17a and 17b showing a region in which a cross-section of the resist 16 has an inclined shape; and an arrow 18 indicating a predetermined range on the surface of the semiconductor. In addition, FIG. 1C shows the region in which the resist 16 is present, the positions of the dotted lines 17a and 17b, the arrow 18 on the semiconductor surface shown in FIG. 1B, a graph showing an impurity concentration on the surface of the semiconductor substrate 15 in the range indicated by the arrow 18, and a solid line 20 indicating the impurity concentration in the graph. Based on the result of an impurity distribution obtained by simulation using a computer in accordance with the Monte Carlo method, the solid line 20 indicating the impurity concentration, and isoconcentration lines 11, 12, 13, and 14 indicating concentrations of $5 \times 10^{15}/cm^3$, $2.5 \times 10^{16}/cm^3$, $7.5 \times 10^{16}/cm^3$, and $2.25 \times 10^{17}/cm^3$, respectively, are obtained.

FIG. 1A is a cross-sectional view of the P-type semiconductor substrate 4 having a P-type conductivity as a whole in which the P-type well 2 having a shallow depth is formed in the semiconductor substrate 4 from the surface thereof. Furthermore, FIG. 1A shows the N-type well region 3a having a large doping depth which is located in a region deeper than the bottom portion of the P-type well region 2, that is, is located in a region apart from the surface of the P-type semiconductor substrate 4. In addition, FIG. 1A shows the region 3b which is simultaneously formed when the N-type well 3a having a large doping depth is formed by high-energy ion implantation, the region 3b being formed of an impurity passing through the end portion of the resist mask since it has an inclined shape. Furthermore, FIG. 1A shows the region 10 corresponding to that shown in FIG. 1B. The region 10 corresponding to that shown in FIG. 1B is a region including a part of the N-type well region 3a having a large doping depth and the region 3b formed in the P-type well region 2 which is implanted with an impurity passing through the resist.

FIG. 1B is an enlarged cross-sectional view of the region 10 shown in FIG. 1A. In addition, FIG. 1B shows the concentration distribution of the impurity in the N-type well region 3a having a large doping depth and the region 3b, which is implanted with an impurity passing through the resist, by the isoconcentration lines 11, 12, 13, and 14, the concentration distribution being obtained by performing high-energy ion implantation of the impurity in a direction along the normal line to the semiconductor substrate 15 in order to form the N-type well region 3a. Furthermore, the dotted line 17a in FIG. 1B indicates the end portion of the resist 16. The dotted line 17b in FIG. 1B indicates the boundary between regions of the resist 16 having a uniform thickness and a non-uniform thickness. In addition, the arrow 18 in FIG. 1B indicates the range in the graph shown in FIG. 1C in the lateral direction.

In the region in which the resist 16 is not present on the surface of the semiconductor substrate 15 shown in FIG. 1B, a band-shaped high impurity concentration region is present in the semiconductor substrate 15 which is surrounded by the isoconcentration lines 14 of $2.25 \times 10^{17}/cm^3$ and which is centered at a depth of approximately 1.5 μm from the surface of the semiconductor substrate 15, and the two sides of this high impurity concentration region in the vertical direction, impurity regions formed by the isoconcentration lines 13 of $7.5 \times 10^{16}/cm^3$, the isoconcentration lines 12 of $2.5 \times 10^{16}/cm^3$, and the isoconcentration lines 11 of $5 \times 10^{15}/cm^3$ are present, so that the above high impurity concentration region is sandwiched thereby.

On the other hand, in the region surrounded by dotted lines 17a and 17b, an impurity region surround by the isoconcentration lines 13 of $7.5 \times 10^{16}/cm^3$ is present in the resist 16 and the semiconductor substrate 15 in the vertical direction, and at the two sides of the above impurity region, impurity regions formed by the isoconcentration lines 12 of $2.5 \times 10^{16}/cm^3$ are present.

The impurity regions described above are formed by the following reasons. First, the thickness of the resist 16 is not uniform in the region between the dotted lines 17a and 17b and is gradually increased in the direction toward the resist 16 side. That is, the cross-sectional shape of the resist 16 is inclined. As a result, since the implanting energy of an impurity which collides against the resist 16 is decreased in accordance with the thickness thereof, at a place at which the resist 16 has a sufficiently large thickness, most of the impurity stays in the resist 16; however, at a place at which the resist 16 has a small thickness, most of the impurity passes through the resist 16 and reaches the substrate. Hence, in accordance with the implanting energy reduced by the resist 16, the average of the depth of the impurity implanted in the semiconductor substrate 15 is changed. Accordingly, the impurity that reaches the substrate diffuses between the surface of the substrate and a place having a depth of 1.5 μm therefrom at which the high impurity concentration region is present in the region in which the resist 16 is not provided, and as a result, the impurity regions described above are formed in the vertical direction. In addition, the impurity which stays in the inclined end portion of the resist 16 is also distributed along the inclined shape of the end portion thereof, and as a result, the impurity regions are also formed in the resist 16 in the vertical direction.

In the region on the surface of the semiconductor substrate 15 in which the resist 16 is present other than that between the dotted lines 17a and 17b, the thickness of the resist 16 is approximately uniform. Hence, the impurity stays in the resist, and as a result, a band-shaped high impurity concentration region is formed in the resist 16, which is sandwiched between the isoconcentration lines 14 of $2.25 \times 10^{17}/cm^3$ and is centered at a depth of approximately 2.0 μm from the surface of the resist 16. In addition, at the two sides of this high impurity concentration region in the vertical direction, impurity regions surrounded by the isoconcentration lines 13 of $7.5 \times 10^{16}/cm^3$, the isoconcentration lines 12 of $2.5 \times 10^{16}/cm^3$, and the isoconcentration lines 11 of $5 \times 10^{15}/cm^3$ are formed so as to sandwich the above high impurity concentration region.

The graph in FIG. 1C is a graph showing the impurity distribution on the surface of the semiconductor substrate 15 in the range indicated by the arrow 18 in FIG. 1B. On the horizontal axis of the graph shown in FIG. 1C, the intersection between the dotted line 17a and the surface of semiconductor substrate 15 is set as the original point, and the range between a distance of −3.0 mm to that of +1.0 μm from the original point in the lateral direction is shown. The vertical axis of the graph shown in FIG. 1C shows the range of an impurity concentration of $1.0 \times 10^{15}/cm^3$ to that of $1.0 \times 10^{18}/cm^3$. The solid line 20 shows the trend of the impurity concentration in which the concentration starts to be increased from $1.5 \times 10^{15}/cm^3$ at a place of −1.5 μm, is gradually increased until the original point, shows a peak value of $8 \times 10^{16}/cm^3$ at a place in the positive region very close to the original point, and is then rapidly decreased at a place further from the original point. The reason for this is that, since the range indicated by the arrow 18 includes the region between the dotted lines 17a and 17b which form the vertical impurity region, the concentration of the impurity is increased in the vicinity of the boundary between places at which the resist 16 is present and is not present.

According to FIGS. 1A, 1B, and 1C, since the implantation of the N-type impurity in the semiconductor substrate 15 cannot be totally inhibited in the boundary area of the N-type well region 3a having a large doping depth when the N-type well 3a is formed, the N-type impurity is implanted in the surface of the P-type well region 2; hence, it is understood that the impurity distribution shown in the graph in FIG. 1C is formed.

Accordingly, when the N-type well 3a is formed by a related manufacturing method which has been performed in the past, a problem may arise in that properties of a MOS (Metal Oxide Semiconductor) transistor provided in the region 3b, which is implanted with an impurity passing through the resist, becomes unstable as compared to those of another MOS transistor.

Among the properties of the MOS transistor formed in the P-type well 2 and in the boundary area of the N-type well region 3a having a large doping depth, for example, leakage properties between a source terminal and a drain terminal may be disadvantageously degraded. Since the function of the P-type impurity in the P-type well region 2 is counteracted by the function of the N-type impurity, a phenomenon occurs similar to the case in which the concentration of the P-type impurity in the P-type well region 2 is decreased. As a result, an electric withstand voltage of P-N junctions formed of the P-type well region 2 with the source and the drain regions is degraded.

In the above description, the case in which the resist 16 has an inclined shape in the boundary; however, even when the resist 16 has an ideally vertical end portion, it is difficult from a technical point of view to make all implantation ions incident perfectly vertically on the semiconductor substrate 15. Hence, even in the case described above, a region having a high impurity concentration is also liable to be formed on the surface of the semiconductor substrate 15.

With reference to FIGS. 2A, 2B, 2C, 3A, 3B, 3C, 4A and 4B, Example 1 will be described. Example 1 is an example relating to a method for manufacturing a semiconductor device in which a P-type well region is formed in a P-type semiconductor substrate from the surface thereof in the depth direction, and in which an N-type impurity region having a large doping depth is formed from the bottom portion of the above P-type well region in the depth direction of the P-type semiconductor substrate.

FIGS. 2A, 2B, and 2C are views for illustrating the method for manufacturing a semiconductor device, according to Example 1, and there are shown high-energy ion implantation 29, a resist mask 21, a region 22 which is implanted with an impurity passing through the resist, an N-type well region 23 having a large doping depth, a P-type well region 24a, a P-type semiconductor substrate 24b, an N-type well region 25 having a large doping depth, a region 26 which is implanted with an impurity passing through the resist, an N-type well region 27 having a large doping depth, and a region 28 which is implanted with an impurity passing through the resist.

As shown in FIG. 2A, the resist 21 is formed on the surface of the P-type semiconductor substrate 24b, and the P-type well region 24a is formed from the surface of the P-type semiconductor substrate 24b in the depth direction thereof. In addition, in FIG. 2A, the state is shown in which the high-energy ion implantation 29 of an N-type impurity is performed for the surface of the P-type semiconductor substrate 24b in a direction along the normal line to the surface thereof by using the resist 21 as a mask. Furthermore, in FIG. 2A, the state is also shown in which the N-type well region 23 having a large doping depth is formed from the bottom portion of the P-type well region 24a in the depth direction of the P-type semiconductor substrate 24b by the high-energy ion implantation 29 of an N-type impurity. In addition, the state is shown in which the region 22 which is implanted with an impurity passing through the resist is formed in the P-type well region 24a located under the end portion of the resist mask 21 by the high-energy ion implantation 29 of an N-type impurity.

In FIG. 2B, the state is shown in which the N-type well region 25 having a large doping depth is formed from the bottom portion of the P-type well region 24a in the depth direction of the P-type semiconductor substrate 24b by the high-energy ion implantation 29 of an N-type impurity. In addition, the state is shown in which the region 26 which is implanted with an impurity passing through the resist is formed in the P-type well region 24a located under the end portion of the resist mask 21 by the high-energy ion implantation 29 of an N-type impurity. In the state described above, the position of the end portion of the resist mask 21 shown in FIG. 2B is changed from that of the resist mask 21 shown in FIG. 2A in a direction so as to increase a region in which the high-energy ion implantation 29 is performed.

In FIG. 2C, the state is shown in which the N-type well region 27 having a large doping depth is formed from the bottom portion of the P-type well region 24a in the depth direction of the P-type semiconductor substrate 24b by the high-energy ion implantation 29 of an N-type impurity. In addition, the state is shown in which the region 28 which is implanted with an impurity passing through the resist is formed in the P-type well region 24a located under the end portion of the resist mask 21 by the high-energy ion implantation 29 of an N-type impurity. In the state described above, the position of the end portion of the resist mask 21 shown in FIG. 2C is changed from that of the resist mask 21 shown in FIG. 2B in a direction so as to increase the region in which the high-energy ion implantation 29 is performed.

According to FIGS. 2A, 2B, and 2C, since the N-type well regions 23, 25, and 27 are impurity regions each having a large doping length, and a region in which the above impurity regions are overlapped with each other is formed by performing the impurity ion implantation a plurality of times while the area on the surface of the semiconductor substrate in which the ion implantation of an impurity is performed is increased, the concentration of the N-type impurity is high. In addition, as will be shown later in FIG. 4B, since the total amount of the impurity is dividedly implanted, compared to the concentration of the N-type impurity implanted in the region 3b after passing through the resist shown in FIG. 1A, the concentrations of the N-type impurity implanted in the regions 22, 26, and 28 after passing through the resist mask 21 are low. Furthermore, since the regions 22, 26, and 28 in the P-type well region 24a, each of which is implanted with an impurity passing through the resist, are formed by performing the high-energy ion implantation 29 a plurality of times while the position of the end portion of the resist mask 21 is changed, the regions 22, 26, and 28 are formed at different places from each other. In the process described above, the amount of change in position of the end portion of the resist mask 21 shown in FIG. 2B is preferably equivalent to that shown in FIG. 2C. The reason for this is that, for example, when the amount of change in position shown in FIG. 2B is not equivalent to that shown in FIG. 2C, although the total amount of the impurity is equally divided by the number of ion implantation steps, the impurity distribution may be deviated in some cases.

As are FIGS. 2A to 2C, FIGS. 3A, 3B, and 3C are views for illustrating a method for manufacturing a semiconductor device, according to Example 1, and there are shown the high-energy ion implantation 29, a resist mask 30, a region 31 which is implanted with an impurity passing through the resist, an N-type well region 32 having a large doping depth, a P-type well region 33a, a P-type semiconductor substrate 33b, an N-type well region 34 having a large doping depth, a region 35 which is implanted with an impurity passing through the resist, an N-type well region 36 having a large doping depth, and a region 37 which is implanted with an impurity passing through the resist.

As shown in FIG. 3A, the resist 30 is formed on the surface of the P-type semiconductor substrate 33b, and the P-type well region 33a is formed from the surface of the P-type semiconductor substrate 33b in the depth direction thereof. In FIG. 3A, the state is shown in which the high-energy ion implantation 29 of an N-type impurity is performed for the surface of the P-type semiconductor substrate 33b in a direction along the normal line to the surface thereof by using the resist 30 as a mask. In addition, in FIG. 3A, the state is also shown in which the N-type well region 32 having a large doping depth is formed from the bottom portion of the P-type well region 33a in the depth direction of the P-type semiconductor substrate 33b by the high-energy ion implantation 29 of an N-type impurity. Furthermore, the state is shown in which the region 31 which is implanted with an impurity passing through the resist is formed in the P-type well region 33a located under the end portion of the resist mask 30 by the high-energy ion implantation 29 of an N-type impurity.

In FIG. 3B, the state is shown in which the N-type well region 34 having a large doping depth is formed from the bottom portion of the P-type well region 33a in the depth direction of the P-type semiconductor substrate 33b by the high-energy ion implantation 29 of an N-type impurity. In addition, the state is shown in which the region 35 which is implanted with an impurity passing through the resist is formed in the P-type well region 33a located under the end portion of the resist mask 30 by the high-energy ion implantation 29 of an N-type impurity. In the state described above, the position of the end portion of the resist mask 30 shown in FIG. 3B is changed from that of the resist mask 30 shown in FIG. 3A in a direction so as to decrease the region in which the high-energy ion implantation 29 is performed.

In FIG. 3C, the state is shown in which the N-type well region 36 having a large doping depth is formed from the bottom portion of the P-type well region 33a in the depth direction of the P-type semiconductor substrate 33b by the high-energy ion implantation 29 of an N-type impurity. In addition, the state is shown in which the region 37 which is implanted with an impurity passing through the resist is formed in the P-type well region 33a located under the end portion of the resist mask 30 by the high-energy ion implantation 29 of an N-type impurity. In the state described above, the position of the end portion of the resist mask 30 shown in FIG. 3C is changed from that of the resist mask 30 shown in FIG. 3B in a direction so as to decrease the region in which the high-energy ion implantation 29 is performed.

According to FIGS. 3A, 3B, and 3C, since the N-type well regions 32, 34, and 36, are impurity regions each having a large doping length, and a region in which the above impurity regions are overlapped with each other is formed by performing the impurity ion implantation a plurality of times while the area on the surface of the semiconductor substrate in which the ion implantation of an impurity is performed is decreased, the concentration of the N-type impurity is high. In addition, as will be shown later in FIG. 4B, since the total amount of the impurity is dividedly implanted, compared to the concentration of the N-type impurity implanted in the region 3b after passing through the resist shown in FIG. 1A, the concentrations of the N-type impurity implanted in the regions 31, 35, and 37 are low. Furthermore, since the regions 31, 35, and 37 in the P-type well region 33a, each of which is implanted with an impurity passing through the resist, are formed by performing the high-energy ion implantation 29 a plurality of times while the position of the end portion of the resist mask 30 is changed, the regions 31, 35, and 37 are formed at different places from each other. In the process described above, the amount of change in position of the end portion of the resist mask 30 shown in FIG. 3B is preferably equivalent to that shown in FIG. 3C. The reason for this is that, for example, when the amount of change in position shown in FIG. 3B is not equivalent to that shown in FIG. 3C, although the total amount of the impurity is equally divided by the number of ion implantation steps, the impurity distribution may be deviated in some cases.

Figure 4A:
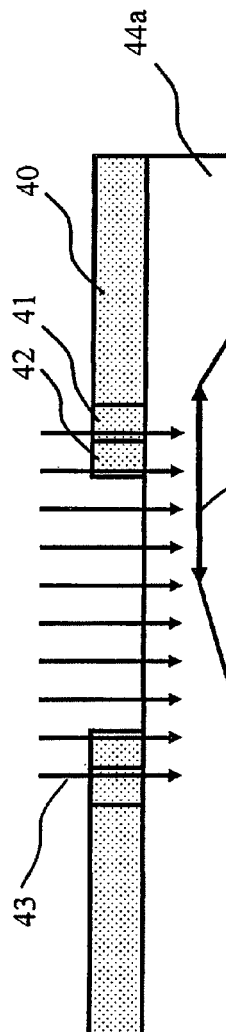
FIGS. 4A and 4B are views for illustrating an impurity distribution of an N-type impurity in a P-type well region in the vicinity of a surface of a semiconductor substrate.
Figure 4B:
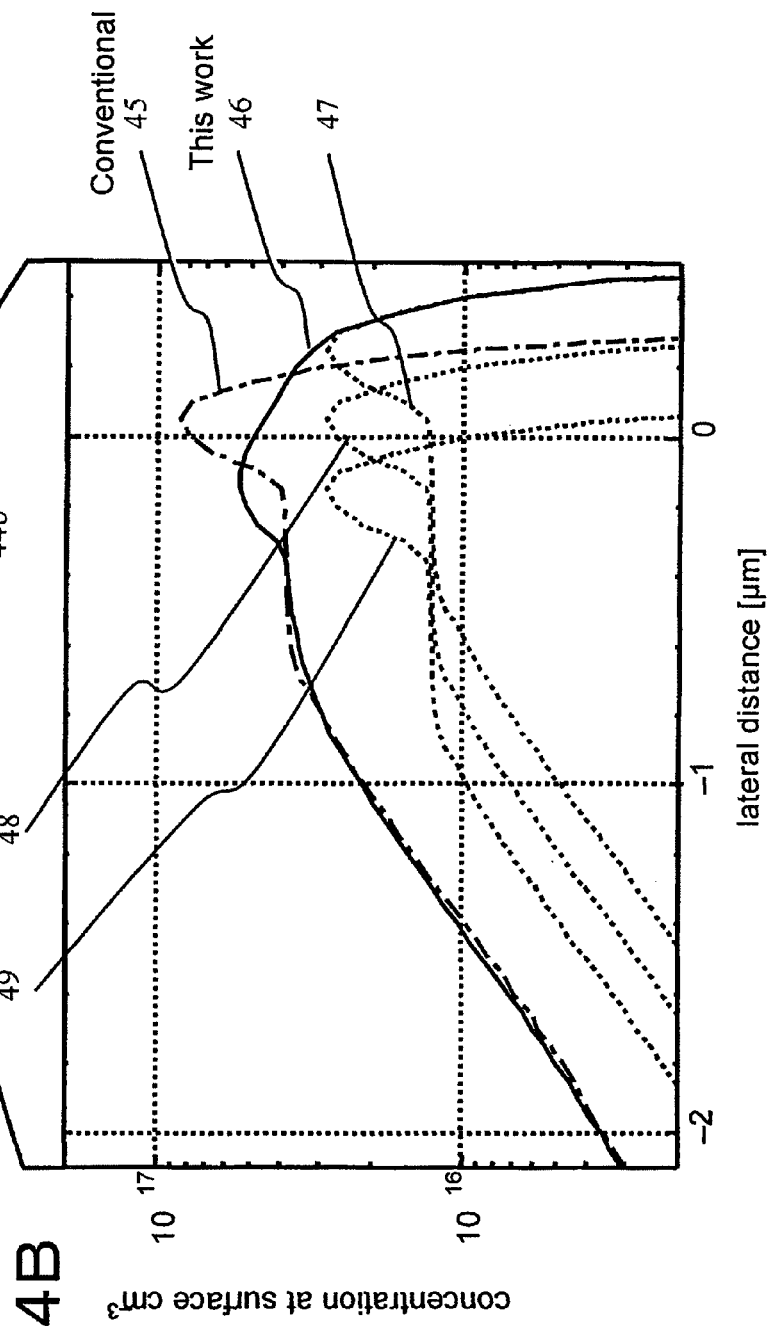

FIGS. 4A and 4B are views for illustrating the impurity distribution in the P-type well region in the vicinity of the surface of the semiconductor substrate, the impurity distribution being generated by the regions shown in FIGS. 2A to 2C or 3A to 3C, each of which is implanted with an impurity passing through the resist. FIG. 4A shows resist masks 40, 41, and 42, high-energy ion implantation 43, and a semiconductor substrate 44a, and FIG. 4B shows an arrow 44b indicating a range in which an concentration distribution of an N-type impurity is shown, a chain line 45 indicating the concentration of an N-type impurity shown in FIG. 1C, a solid line 46 indicating the total concentration of all the N-type impurities implanted by the ion implantation steps shown in FIGS. 2A to 2C or FIGS. 3A to 3C, a dotted line 47 indicating the concentration of the N-type impurity implanted by the high-energy ion implantation shown in FIG. 2A or 3A, a dotted line 48 indicating the concentration of the N-type impurity implanted by the high-energy ion implantation shown in FIG. 2B or 3B, and a dotted line 49 indicating the concentration of the N-type impurity implanted by the high-energy ion implantation shown in FIG. 2C or 3C. In the case described above, the dotted lines 47 to 49 are obtained based on the assumption in which the implantation shown by the chain line 45 is equally divided by 3 times, that is, in other words, it is assumed that one third of the amount of the implanted impurity indicated by the chain line 45 corresponds to that indicated by each of the dotted lines 47 to 49, and that the ion species and the energy are the same as those of the implantation shown by the chain line 45.

FIG. 4A shows the state in which high-energy ion implantation is performed a plurality of times on the semiconductor substrate 44a by using the resist masks 40, 41, and 42 having end portions located at different positions from each other. In addition, the arrow 44b shown in FIG. 4A indicates a range shown in FIG. 4B which is in the vicinity of the surface of the semiconductor substrate and in the boundary area located at the right side of the region in which high-energy ion implantation is performed.

FIG. 4B is a graph showing the concentration distribution of an N-type impurity in the vicinity of the surface of the semiconductor substrate indicated by the arrow 44b. The vertical axis shows the concentration of an N-type impurity in the range of $1.0 \times 10^{15}/cm^3$ to $5.0 \times 10^{17}/cm^3$ on a log scale. In addition, the horizontal axis shows the position on the surface of the semiconductor substrate from $-1.9$ μm to $0.5$ μm while the position of the end portion of the resist mask 41 is set as the original point.

According to FIGS. 4A and 4B, the N-type impurity that is implanted by the high-energy ion implantation using the resist mask 40 and that passes through a thin part of the resist mask 40 at the end portion thereof stays in the vicinity of the surface of the semiconductor substrate and has an impurity concentration distribution shown by the dotted line 47. That is, the impurity concentration distribution shown by the dotted line 47 shows an impurity concentration distribution having a peak concentration of $2.0 \times 10^{16}/cm^3$ at a position of approximately 0.25 μm. The N-type impurity that is implanted by the high-energy ion implantation using the resist mask 41 and that passes through a thin part of the resist mask 41 at the end portion thereof stays in the vicinity of the surface of the semiconductor substrate and has an impurity concentration distribution shown by the dotted line 48. That is, the impurity concentration distribution shown by the dotted line 48 shows an impurity concentration distribution having a peak concentration of $2.0 \times 10^{16}/cm^3$ at a position of approximately 0.05 μm. The N-type impurity that is implanted by the high-energy ion implantation using the resist mask 42 and that passes through a thin part of resist mask 42 at the end portion thereof stays in the vicinity of the surface of the semiconductor substrate and has an impurity concentration distribution shown by the dotted line 49. That is, the impurity concentration distribution shown by the dotted line 49 shows an impurity concentration distribution having a peak concentration of $2.0 \times 10^{16}/cm^3$ at a position of approximately $-0.15$ μm.

After the N-type impurity is implanted by a plurality of the high-energy implantation steps so as to have the concentration distributions shown by the dotted lines 47, 48, and 49, the above impurity concentrations are added together, and as a result, the impurity concentration distribution shown by the solid line 46 is realized. That is, the impurity concentration distribution shown by the solid line 46 is an impurity concentration distribution having a peak concentration of $5.5 \times 10^{16}/cm^3$ at a position of $-0.2$ μm. Accordingly, although the impurity concentration distribution shown by the chain line 45 has a peak concentration of $8.5 \times 10^{16}/cm^3$ at around the original point, the peak concentration of the impurity concentration distribution shown by the solid line 46 is low. The reason for this is that since the resist masks 40, 41, and 42 are used when the high-energy ion implantation is performed, the position at which the implantation of the N-type impurity is performed is changed.

In the method for manufacturing a semiconductor device, according to Example 1, there are provided a step of forming one optional impurity region which is apart from the surface of the semiconductor substrate and is provided from the bottom portion of the P-type well region formed in the semiconductor substrate in the depth direction thereof, and in this step, ion implantation is performed a plurality of times while the position of the end portion of the mask pattern for ion implantation is changed.

As a result, according to the method for manufacturing a semiconductor device of Example 1, a part of said one optional impurity region having a high impurity concentration may form an impurity region having a concentration approximately equivalent to that in the N-type well region 3a shown in FIG. 1A. On the other hand, in order to form said one optional impurity region, since the ion implantation is performed a plurality of times while the position of the end portion of the mask pattern for ion implantation is changed, the impurity concentration of each region formed in the P-type well region by the N-type impurity implanted therein after passing through the end portion of the resist mask is decreased. As a result, when a semiconductor element is formed in the P-well region and even in the boundary area of said one optional impurity region, the change in electrical properties of the semiconductor element can be suppressed. For example, the increase in leakage current between terminals of an active element disposed in the P-type well region can be suppressed.

FIG. 4 shows an example in which the ion implantation steps for obtaining the dotted lines 47 to 49 are performed by using the same ion species, the same amount thereof, and the same implantation energy while the amounts of change in position of the end portion of the mask are set equivalent to each other. In order to obtain the effect of the present invention, it is most preferable to increase the number of ion implantation steps which are performed by using the same ion species, the same amount thereof, and the same implantation energy while the amounts of change in position of the end portion of the mask are set equivalent to each other. However, the number of ion implantation steps and the impurity amounts thereof are not limited thereto, and the implantation energy, the implantation ion species, and the amount of change in position of the end portion of the mask may also be variously changed.

EXAMPLE 2

Example 2 will be described with reference to FIGS. 5A to 5D, 6A to 6D, and 7A to 7D.

As shown in the above figures, Example 2 is an example relating to a method for manufacturing a semiconductor device in which there are formed a well region having a predetermined depth from a surface of a semiconductor substrate, one impurity region formed in the semiconductor substrate from the bottom portion of the above well region in the depth direction of the substrate, and a semiconductor element formed in the well region and in a boundary area of said one impurity region when viewed in plan.

FIGS. 5A to 5D are views for illustrating a method for manufacturing a semiconductor device, according to Example 2. In the manufacturing method described above, when a P-type well region or an N-type well region formed in the semiconductor substrate from the surface thereof, and an active element formed in the P-type well region or the N-type well region and in the boundary area of one impurity region are provided beforehand, said one impurity region is formed from the bottom portion of the P-type well region or that of the N-type region in the depth direction of the semiconductor substrate.

In addition, FIGS. 5A to 5D show a resist mask 50, a semiconductor element 51, a P-type well region 52, one impurity region 53 which is formed by high-energy ion implantation of an N-type impurity and which is apart from the surface of the semiconductor substrate, one impurity region 55 which is formed by high-energy ion implantation of a P-type impurity and which is apart from the surface of the semiconductor substrate, and an N-type well region 56. The semiconductor element 51 may be any type of element as long as the properties thereof will be influenced to some extent by an impurity concentration, and for example, an active element such as a transistor including a MOS transistor, or a diode, a capacitor, or a resistor may be mentioned.

Figure 5A:
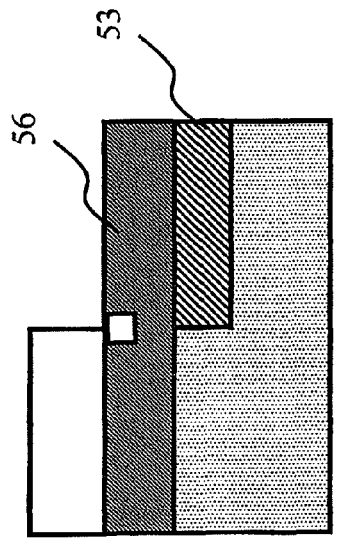
FIGS. 5A to 5D are views for illustrating a method for manufacturing a semiconductor device, according to Example 2.
Figure 5B:
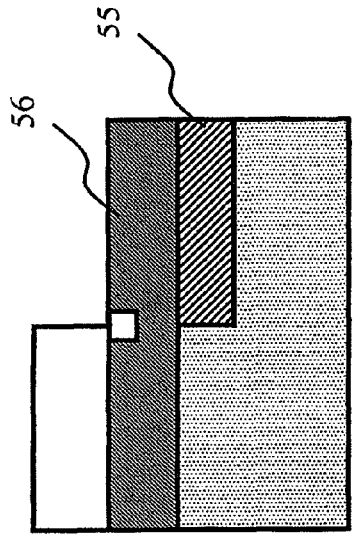
Figure 5C:
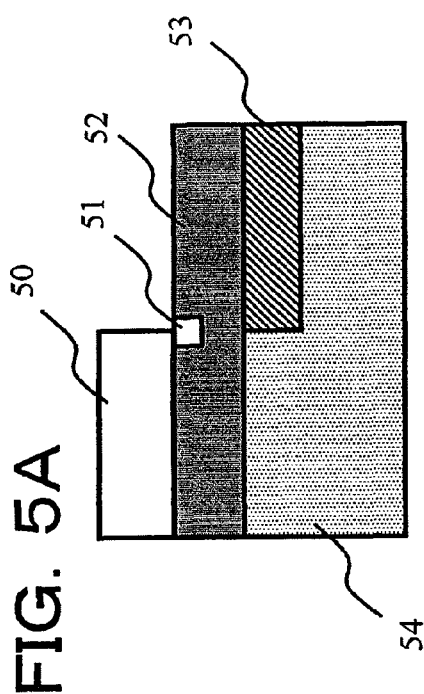
Figure 5D:
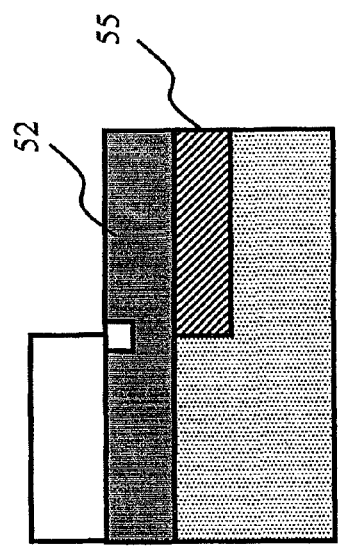

FIG. 5A shows a semiconductor device in which the P-type well region 52 and the N-type impurity region 53 are formed in the semiconductor substrate. FIG. 5B shows a semiconductor device in which the N-type well region 56 and the N-type impurity region 53 are formed in the semiconductor substrate. FIG. 5c shows a semiconductor device in which the P-type well region 52 and the P-type impurity region 55 are formed in the semiconductor substrate. FIG. 5D shows a semiconductor device in which the N-type well region 56 and the P-type impurity region 55 are formed in the semiconductor substrate.

In addition, the semiconductor devices shown in FIGS. 5A to 5D are each formed by the following manufacturing method. First, a step is performed in which the N-type impurity or the P-type impurity is ion-implanted in the semiconductor substrate, followed by heat treatment, so that the N-type well region 56 or the P-type well region 52 is formed in the semiconductor substrate. Next, in order to increase or decrease the area on the surface of the semiconductor substrate in which the ion implantation is to be performed, a step is performed in which while the position of the end portion of the resist mask 50 is changed, high-energy ion implantation of the N-type or the P-type impurity is performed a plurality of times, so that the impurity region 53 or 55 is formed. Subsequently, a step is performed in which in the N-type well region 56 or the P-type well region 52, the predetermined semiconductor element 51 is formed. In the above process, the steps are not always necessarily performed in that order as described above, and the order of the steps may be optionally changed.

As are FIGS. 5A to 5D, FIGS. 6A, 6B, 6C, and 6D are views for illustrating a method for manufacturing a semiconductor device, according to Example 2. In the above manufacturing method, when a P-type well region, an impurity region formed in the semiconductor substrate at a place deeper than the bottom portion of the P-type well region, and a semiconductor element formed in the P-type well region are provided beforehand, one impurity region is formed in the semiconductor substrate at a place apart from the surface thereof by high-energy ion implantation of an impurity.

In addition, FIGS. 6A, 6B, 6C to 6D show a resist mask 60, a P-type well region 61, a P-type impurity region 62 having a large doping length, high-energy ion implantation 63 of an N-type impurity, a semiconductor substrate 64, a semiconductor element 65, high-energy ion implantation 66 of a P-type impurity, and an N-type impurity region 67 having a large doping depth. The semiconductor element 65 is similar to the semiconductor element shown in FIGS. 5A to 5D.

FIG. 6A shows a semiconductor device in which there are provided the P-type well region 61 formed from the surface of the semiconductor substrate 64 in the depth direction thereof, the N-type impurity region 67 and the P-type impurity region 62, both having a large doping depth and being formed from the bottom portion of the P-well region 61 in the depth direction thereof, and the semiconductor element 65 formed over the boundary area between the N-type impurity region 67 and the P-type impurity region 62.

FIG. 6B shows the state in which when the P-type well region 61 formed from the surface of the semiconductor substrate 64 in the depth direction thereof, the semiconductor element 65, and the P-type impurity region 62 having a large doping depth are formed beforehand, in order to form one N-type impurity region, that is, the N-type impurity region 67 having a large doping depth, the high-energy ion implantation 63 of an N-type impurity is performed a plurality of times while the position of the end portion of the resist mask 60 is changed. In the state described above, the boundary area of the P-type impurity region 62 having a large doping depth is overlapped with the semiconductor element 65 when viewed in plan. In addition, the N-type impurity region 67 having a large doping depth is formed adjacent to the P-type impurity region 62 when viewed in plan. As a result, the semiconductor device shown in FIG. 6A is formed.

FIG. 6C shows the state equivalent to that shown in FIG. 6B. As a result, the semiconductor device shown in FIG. 6A is formed. However, the P-type impurity region 62 extends under all the bottom portion of the P-type well region 61 and is overlapped with the semiconductor element 65 when viewed in plan. In addition, the boundary area of the N-type impurity region 67 is overlapped with the semiconductor element 65 when viewed in plan. In addition, the amount of the N-type impurity, which is implanted by the high-energy ion implantation 63 performed a plurality of times while the position of the end portion of the resist mask 60 is changed, is an amount that can compensate for that of the P-type impurity of the P-type impurity region 62 and can also form the N-type impurity region 67. Furthermore, the above amount of the N-type impurity is larger than that of the N-type impurity implanted by the high-energy implantation 63 performed a plurality of times shown in FIG. 6B.

FIG. 6D shows the state in which when the P-type well region 61 formed from the surface of the semiconductor substrate 64 in the depth direction thereof, the semiconductor element 65, and the N-type impurity region 67 having a large doping depth are provided beforehand, in order to form one P-type impurity region, that is, the P-type impurity region 62 having a large doping depth, the high-energy ion implantation 66 of a P-type impurity is performed a plurality of times while the position of the end portion of the resist mask 60 is changed. As a result, the semiconductor device shown in FIG. 6A is formed. In this case, the N-type impurity region 67 extends under all the bottom portion of the P-type well region 61 and is overlapped with the semiconductor element 65 when viewed in plan. In addition, the boundary area of the P-type impurity region 62 is overlapped with the semiconductor element 65 when viewed in plan. Furthermore, the amount of the P-type impurity, which is implanted by the high-energy implantation 66 performed a plurality of times while the position of the end portion of the resist mask 60 is changed, is an amount that can compensate for that of the N-type impurity of the N-type impurity region 67 and can also form the P-type impurity region 62.

According to the description with reference to FIGS. 6A, 6B, 6C, and 6D, when the high-energy implantation 66 of a P-type impurity and the high-energy implantation 63 of an N-type impurity are performed a plurality of times while the area on the surface of the semiconductor substrate in which ion implantation is to be performed is increased or decreased, the position of the end portion of the resist mask 60 is changed. As a result, at the end portion of the resist mask 60, the distribution of the impurity passing through the resist is changed from high-energy ion implantation to high-energy ion implantation. In addition, in order to obtain a predetermined impurity concentration by a plurality of high-energy implantation steps, when the number of high-energy implantation steps is represented by N, the amount of impurity implanted by one high-energy ion implantation step is obtained when the above predetermined amount is divided by the number N. That is, as shown in FIG. 4B, the impurity implanted in the P-type well region after passing through the resist mask 60 is dispersively distributed, and hence the peak concentration of the impurity implanted after passing through the resist is decreased.

As are FIGS. 5A to 5D, FIGS. 7A, 7B, 7C, and 7D are views for illustrating a method for manufacturing a semiconductor device, according to Example 2. In the above manufacturing method, when an N-type well region, an impurity region formed in the semiconductor substrate at a place deeper than the bottom portion of the N-type well region, and a semiconductor element formed in the N-type well region are provided beforehand, one impurity region is formed in the semiconductor substrate at a place apart from the surface thereof by high-energy ion implantation of an impurity.

In addition, FIGS. 7A, 7B, 7C to 7D show a resist mask 70, an N-type well region 71, a P-type impurity region 72 having a large doping length, high-energy ion implantation 73 of an N-type impurity, a semiconductor substrate 74, a semiconductor element 75, high-energy ion implantation 76 of a P-type impurity, and an N-type impurity region 77 having a large doping depth. The semiconductor element 75 is similar to the semiconductor element shown in FIGS. 5A to 5D.

Figure 7A:
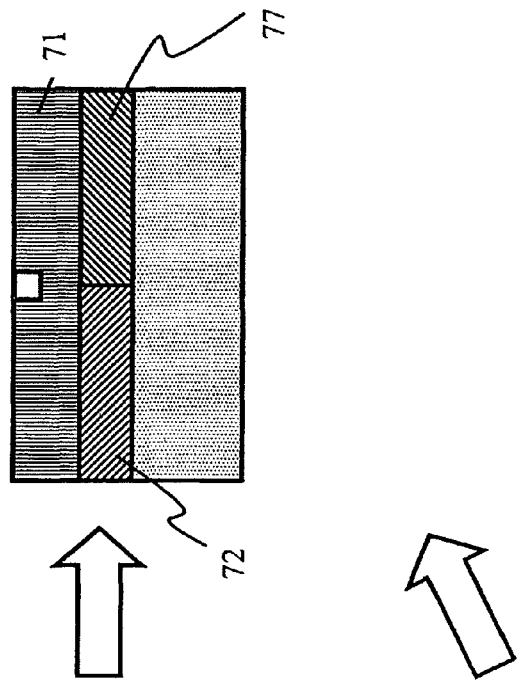
FIGS. 7A to 7D are views, as those shown in FIGS. 5A to 5D, for illustrating a method for manufacturing a semiconductor device, according to Example 2.

FIG. 7A shows a semiconductor device similar to that shown in FIG. 6A; however, the different point is that a region formed from the surface of the semiconductor substrate in the depth direction thereof is the N-type well region 71. That is, the semiconductor element 75 is formed in the N-type well region 71.

Figure 7B:
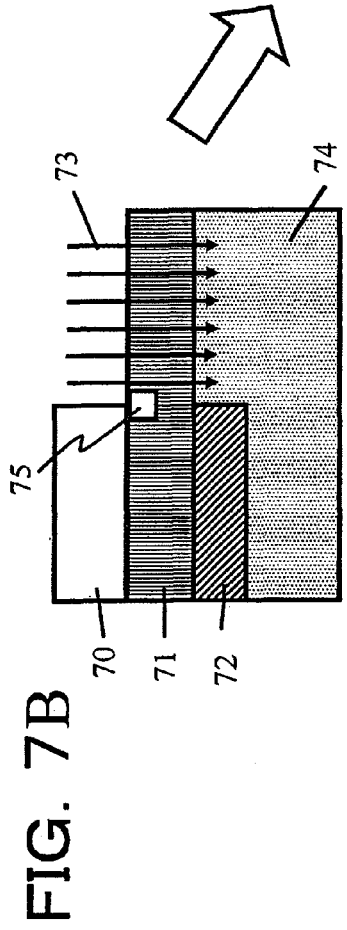

FIG. 7B shows the state in which the high-energy ion implantation 73 of an N-type impurity is performed in a manner similar to that shown in FIG. 6B. However, the different point from that shown in FIG. 6B is that the N-type well region 71 is formed beforehand instead of the P-type well region.

Figure 7C:
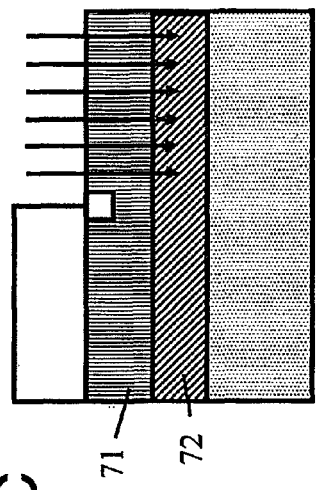

FIG. 7C shows the state in which the high-energy ion implantation 73 of an N-type impurity is performed in a manner similar to that shown in FIG. 6C. However, the different point from that shown in FIG. 6C is that the N-type well region 71 is formed beforehand instead of the P-type well region.

Figure 7D:
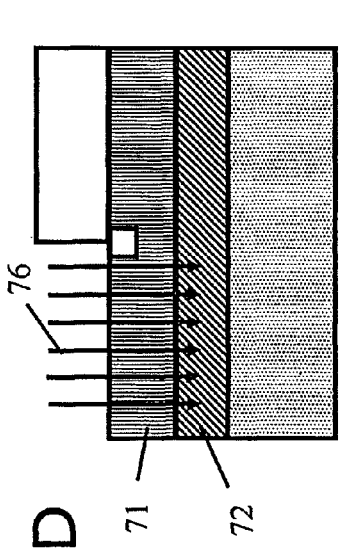

FIG. 7D shows the state in which the high-energy ion implantation 76 of a P-type impurity is performed in a manner similar to that shown in FIG. 6D. However, the different point from that shown in FIG. 6D is that the N-type well region 71 is formed beforehand instead of the P-type well region.

According to the description with reference to FIGS. 7A, 7B, 7C, and 7D, when the high-energy ion implantation 76 of a P-type impurity and the high-energy implantation 73 of an N-type impurity are performed a plurality of times while the area on the surface of the semiconductor substrate in which ion implantation is to be performed is increased or decreased, the position of the end portion of the resist mask 70 is changed. As a result, at the end portion of the resist mask 70, the distribution of the impurity passing through the resist is changed from high-energy ion implantation to high-energy ion implantation. In addition, in order to obtain a predetermined impurity concentration by a plurality of high-energy ion implantation steps, when the number of high-energy ion implantation steps is represented by N, the amount of impurity implanted by one high-energy ion implantation step is obtained when the above predetermined amount is divided by the number N. That is, as shown in FIG. 4B, the impurity implanted in the N-type well region after passing through the resist mask 70 is dispersively distributed, and hence the peak concentration of the impurity implanted after passing through the resist is decreased.

Example 2 is an example relating to a method for manufacturing a semiconductor device which includes a well region having a predetermined depth from a surface of a semiconductor substrate, one impurity region formed from the bottom portion of the well region in the depth direction of the semiconductor substrate, and a semiconductor element formed in the well region and also in the boundary area of said one impurity region when viewed in plan, and in the method described above, in order to form said one impurity region, a plurality of high-energy ion implantation steps is performed while the position of an end portion of a resist mask is changed.

Hence, according to the method for manufacturing a semiconductor device, of Example 2, at the end portion of the resist mask, the distribution of the impurity passing through the resist is changed from high-energy ion implantation to high-energy ion implantation. In addition, in order to obtain a predetermined impurity concentration by a plurality of high-energy ion implantation steps, when the number of high-energy ion implantation steps is represented by N, the amount of impurity implanted by one high-energy ion implantation step is obtained when the above predetermined amount is divided by the number N. That is, as shown in FIG. 4B, the impurity implanted in the well region after passing through the resist mask is dispersively distributed, and hence the peak concentration of the impurity implanted after passing through the resist is decreased.

EXAMPLE 3

With reference to FIGS. 8A to 8C, 9A and 9B, 10A to 10D, 11A to 11D, 12A to 12D, and 13A to 13D, Example 3 will be described. Example 3 is an example relating to a method for manufacturing a semiconductor device in which a triple well structure is formed and CMOS transistors are provided in this triple well, and in this example, one impurity region forming a triple well structure is formed by high-energy ion implantation of an impurity.

Figure 8A:
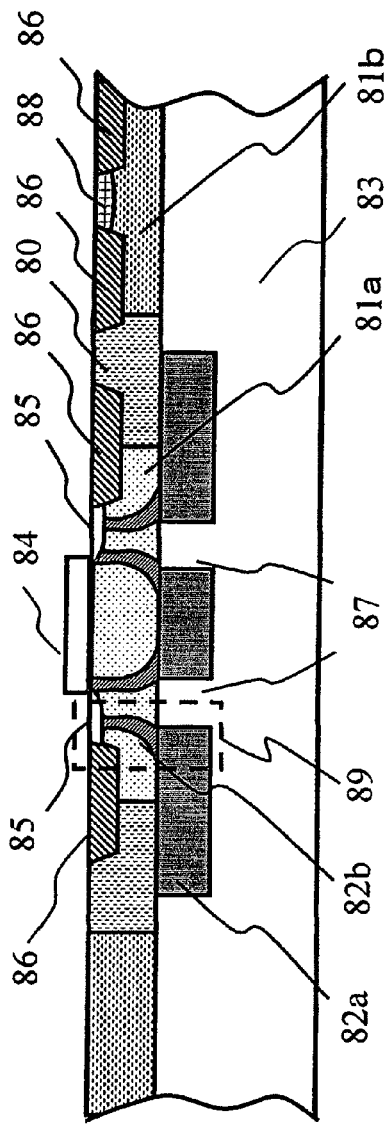
FIGS. 8A to 8C are views for illustrating in detail problems of a related method for manufacturing a semiconductor device having a triple well structure.

First, with reference to FIGS. 8A, 8B, and 8C, problems of a related method for manufacturing a semiconductor device will be described in detail. FIG. 8A shows an N-type well region 80 having a small doping depth, a P-type well region 81a forming a triple well structure, a P-type well region 81b not forming a triple well structure, an N-type well region 82a having a large doping depth, a region 82b which is implanted with an impurity passing through a resist, a P-type semiconductor substrate 83, a gate electrode and a channel region 84 of a MOS transistor, a source and a drain region 85, an element isolation region 86 formed of a thick oxide film, a penetrating region 87 connecting a P-type well region to a semiconductor substrate through the N-type well region 82a, a well tap 88 applying an electrical potential to the P-type well region 81b not forming a triple well structure, and a region 89 to be enlarged.

Figure 8C:
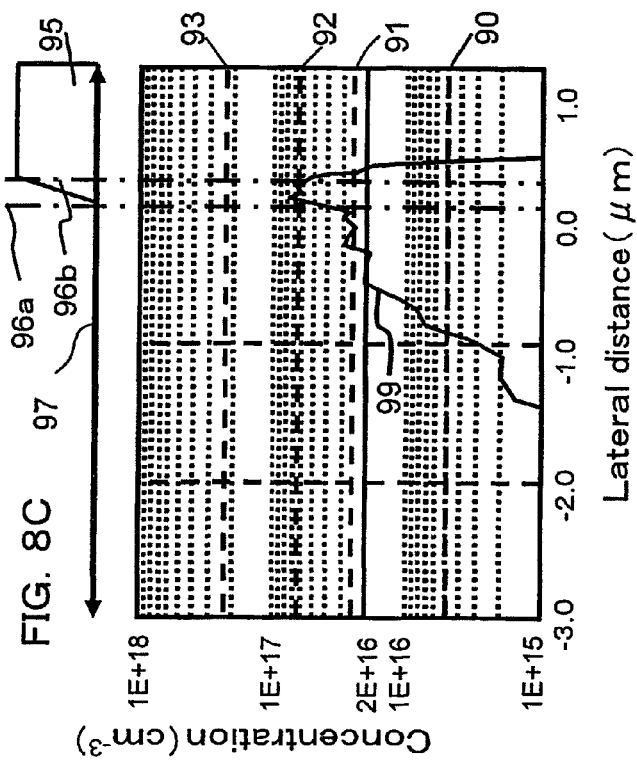
Figure 8B:
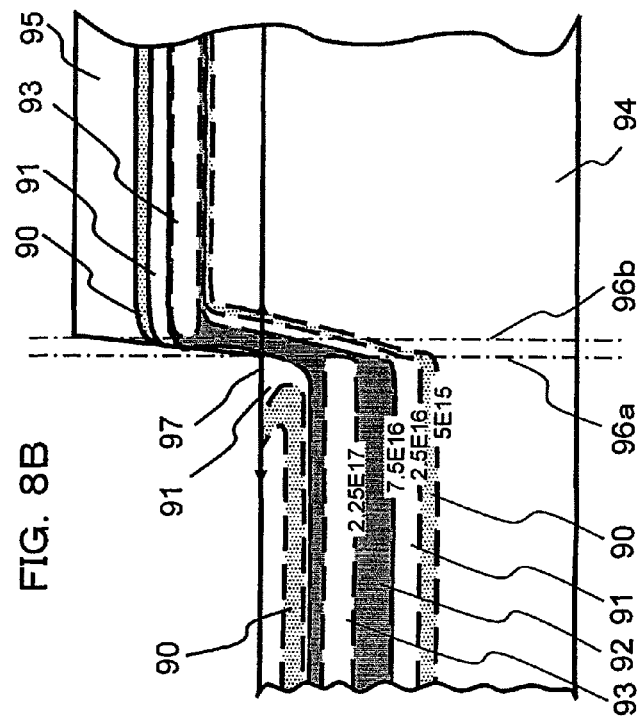

In addition, FIG. 8B is a cross-sectional view of a semiconductor substrate 94 and a resist 95, and in the figure, there are shown isoconcentration lines 90, 91, 92, and 93 indicating concentrations of $5\times10^{15}/cm^3$, $2.5\times10^{16}/cm^3$, $7.5\times10^{16}/cm^3$, and $2.25\times10^{17}/cm^3$, respectively; the semiconductor substrate 94; the resist 95; dotted lines 96a and 96b showing a region in which a cross-section of the resist 95 has an inclined shape; and an arrow 97 indicating a predetermined range on the surface of the semiconductor. In addition, FIG. 8C shows the region in which the resist 95 is present, the positions of the dotted lines 96a and 96b, the arrow 97 on the semiconductor surface shown in FIG. 8B, a graph showing an impurity concentration on the surface of the semiconductor substrate in the range indicated by the arrow 97, and a solid line 99 indicating the impurity concentration in the graph. Based on the result of an impurity distribution obtained by simulation using a computer in accordance with the Monte Carlo method, the solid line 99 indicating the impurity concentration, and the isoconcentration lines 90, 91, 92, and 93 indicating concentrations of $5\times10^{15}/cm^3$, $2.5\times10^{16}/cm^3$, $7.5\times10^{16}/cm^3$, and $2.25\times10^{17}/cm^3$, respectively, are obtained.

FIG. 8A is a cross-sectional view of the P-type semiconductor substrate 83 having a P-type conductivity as a whole in which the N-type well region 82a having a large doping depth and the N-type well region 80 having a small doping depth are formed. Furthermore, FIG. 8A shows that in an N-type well region formed of the N-type well regions 82a and 80, the P-type well region 81a forming a triple well structure is formed. In addition, FIG. 8A shows that in the P-type well region 81a forming a triple well structure, a MOS transistor, the element isolation region 86, and the region 82b, which is implanted with an impurity passing through the resist, are formed. The MOS transistor is formed of the gate electrode and the channel region 84 and the source region and the drain region 85. In addition, FIG. 8A shows that the MOS transistor is disposed over the penetrating region 87. The region 82b is formed in the boundary area of the penetrating region 87 when viewed in plan and is formed in the P-type well region 81a. FIG. 8A shows that the element isolation region 86 and the well tap 88 are formed in the P-type well region 81b. The well tap 88 functions to apply an electrical potential to the P-type well region 81b. In addition, the electrical potential applied from the well tap 88 is also applied to the P-type well region 81a through the penetrating region 87. In this example, the region 89 corresponds to the region shown in FIG. 8B.

FIG. 8B is an enlarged view of the region 89 shown in FIG. 8A and shows a cross-sectional view of the resist 95 and the semiconductor substrate 94, the resist 95 being provided at the boundary area of the penetrating region 87 as a mask to be used when impurity implantation is performed for forming the N-type well region 82a having a large doping depth and the penetrating region 87. In addition, FIG. 8B shows the concentration distribution of the impurity by the isoconcentration lines 90, 91, 92, and 93, which are obtained by implanting the impurity in a direction along the normal line to the semiconductor substrate in order to form the N-type well region 82a and the penetrating region 87. Furthermore, the dotted line 96a in FIG. 8B shows the end portion of the resist 95. The dotted line 96b in FIG. 8B shows the boundary between regions of the resist 95 having a uniform thickness and a non-uniform thickness. In addition, the arrow 97 in FIG. 8B indicates the range in the graph shown in FIG. 8C in the lateral direction.

In the region in which the resist 95 is not present on the surface of the semiconductor substrate 94 shown in FIG. 8B, a band-shaped high impurity concentration region is present in the semiconductor substrate 94 which is surrounded by the isoconcentration lines 93 of $2.25 \times 10^{17}/cm^3$ and which is centered at a depth of approximately 1.5 µm from the surface of the semiconductor substrate 94, and the two sides of this high impurity concentration region in the vertical direction, impurity regions formed by the isoconcentration lines 92 of $7.5 \times 10^{16}/cm^3$, the isoconcentration lines 91 of $2.5 \times 10^{16}/cm^3$, and the isoconcentration lines 90 of $5 \times 10^{15}/cm^3$ are present, so that the above high impurity concentration region is sandwiched thereby.

On the other hand, in the region surrounded by the dotted lines 96a and 96b, the region 82b which is implanted with the impurity passing through the resist is formed in the resist 95 and the semiconductor substrate 94, an impurity region surround by the isoconcentration lines 92 of $7.5 \times 10^{16}/cm^3$ is formed, and at the two sides of the above impurity region, impurity regions formed by the isoconcentration lines 91 of $2.5 \times 10^{16}/cm^3$ are present.

The region 82b which is implanted with the impurity passing through the resist as described above is formed by the following reasons. First, the thickness of the resist 95 is not uniform in the region between the dotted lines 96a and 96b and is gradually increased in the direction toward the resist side. That is, the cross-sectional shape of the resist 95 is inclined. As a result, since the implanting energy of an impurity which collides against the resist 95 is decreased in accordance with the thickness thereof, at a place at which the resist 95 has a sufficiently large thickness, most of the impurity stays in the resist 95; however, at a place at which the resist 95 has a small thickness, most of the impurity passes through the resist 95 and reaches the substrate. Hence, in accordance with the implanting energy reduced by the resist 95, the average of the depth of the impurity implanted in the semiconductor substrate 94 is changed. Accordingly, the impurity that reaches the substrate diffuses between the surface of the substrate and a place having a depth of 1.5 µm therefrom at which the high impurity concentration region is present in the region in which the resist 95 is not provided, and as a result, the region 82b which is implanted with the impurity passing the resist is formed in the vertical direction. In addition, the impurity which stays in the inclined end portion of the resist 95 is also distributed along the inclined shape of the end portion thereof, and as a result, the impurity region is formed in the resist 95 in the vertical direction.

In the region on the surface of the semiconductor substrate 94 in which the resist 95 is present other than that between the dotted lines 96a and 96b, the thickness of the resist 95 is approximately uniform. Hence, the impurity stays in the resist, and as a result, a band-shaped high impurity concentration region is formed in the resist 95, which is sandwiched between the isoconcentration lines 93 of $2.25 \times 10^{17}/cm^3$ and is centered at a depth of approximately 2.0 µm from the surface of the resist 95. In addition, at the two sides of this high impurity concentration region in the vertical direction, impurity regions surrounded by the isoconcentration lines 92 of $7.5 \times 10^{16}/cm^3$, the isoconcentration lines 91 of $2.5 \times 10^{16}/cm^3$, and the isoconcentration lines 90 of $5 \times 10^{15}/cm^3$ are formed so as to sandwich the above high impurity concentration region.

The graph in FIG. 8C is a graph showing the impurity distribution on the surface of the semiconductor substrate 94 in the range indicated by the arrow 97 in FIG. 8B. On the horizontal axis of the graph shown in FIG. 8C, the intersection between the dotted line 96a and the surface of semiconductor substrate 94 is set as the original point, and the range between a distance of −3.0 µm to that of +1.0 µm from the original point in the lateral direction is shown. The vertical axis of the graph shown in FIG. 8C shows the range of an impurity concentration of $1.0 \times 10^{15}/cm^3$ to that of $1.0 \times 10^{18}/cm^3$. The solid line 99 shows the trend of the impurity concentration in which the concentration starts to be increased from $1.5 \times 10^{15}/cm^3$ at a place of −1.5 µm, is gradually increased until the original point, shows a peak value of $8 \times 10^{16}/cm^3$ at a place in the positive region very close to the original point, and is then rapidly decreased at a place further from the original point. The reason for this is that, since the range indicated by the arrow 97 includes the region between the dotted lines 96a and 96b which form the vertical impurity region, the concentration of the impurity is increased in the vicinity of the boundary between places at which the resist 95 is present and is not present.

According to FIGS. 8A, 8B, and 8C, when the penetrating region 87 is formed in the N-type well region 82a having a large doping depth, since the impurity implantation of an N-type impurity into the semiconductor substrate cannot be totally inhibited at the boundary of the penetrating region 87, an impurity distribution is formed on the surface of the P-type well region 81a forming a triple well structure as shown in the graph in FIG. 8C. As a result, when the triple well structure is formed by a related manufacturing method, properties of a MOS transistor, which is formed in the P-type well region 81a forming a triple well structure and which is overlapped with the boundary area of the penetrating region 87, are disadvantageously degraded as compared to those of other MOS transistors. Of the properties of a MOS transistor, which is formed in the P-type well region 81a forming a triple well structure and which is overlapped with the boundary area of the penetrating region 87, for example, leakage properties between the source terminal and the drain terminal may be disadvantageously degraded. Since the function of the P-type impurity in the P-type well region 81a is counteracted by the N-type impurity, a phenomenon occurs similar to the case in which the concentration of the P-type impurity in the P-type well region 81a is decreased. As a result, an electric withstand voltage of P-N junctions is degraded which are formed of a part of the P-type well region 81a present at the boundary area of the penetrating region 87 and the source and the drain regions 85.

In addition, when the penetrating region penetrating the N-type well region, which is formed at the bottom portion of the P-type well region, is small or is disposed very far from a transistor, supply of electricity to the P-type well region becomes unstable, and as a result, the properties of the transistor on the P-type well region becomes unstable. The reason for this is that when being small as described above, the penetrating region may be closed in some cases due to a depletion layer between different impurities. In addition, the reason for this is that when the penetrating region is disposed very far from a transistor, the resistance between the transistor and the electricity supply position is increased, and as a result, quick response to the decrease in voltage cannot be performed.

Furthermore, in order to form an N-type well region having a large doping depth and a penetrating region, an N-type impurity is implanted at high energy into a region in which the above N-type well region is to be formed, and hence it is difficult to form a penetrating region having a fine pattern. Accordingly, in general, the penetrating region is large as compared to the entire size of a transistor. Hence, as described in Japanese Unexamined Patent Application Publication No. 10-199993, when the penetrating region is intentionally formed at a place other than that under the transistor, the size of the P-type well region is increased corresponding to that of the penetrating region, and as a result, it is difficult to decrease the size of the P-type well region.

Figure 9A:
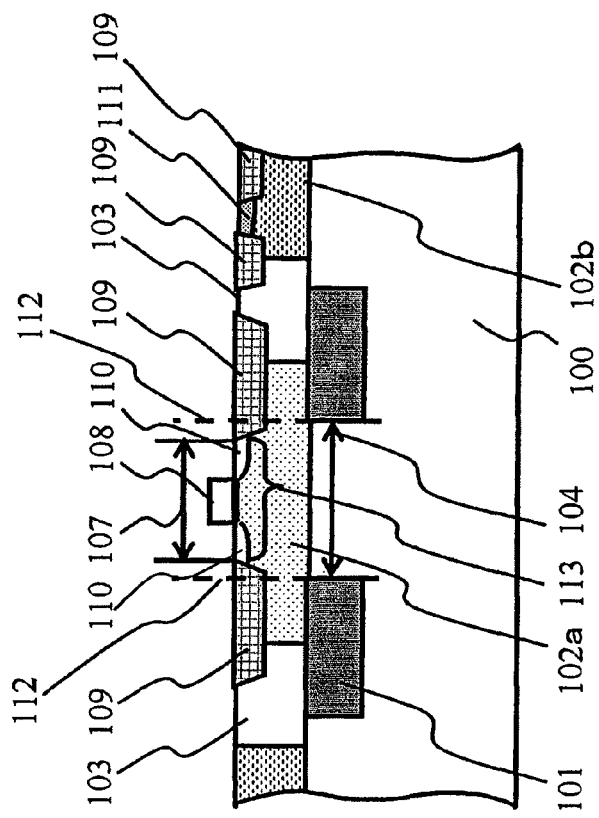
FIG. 9A is a plan view of a semiconductor device according to Example 3.
Figure 9B:
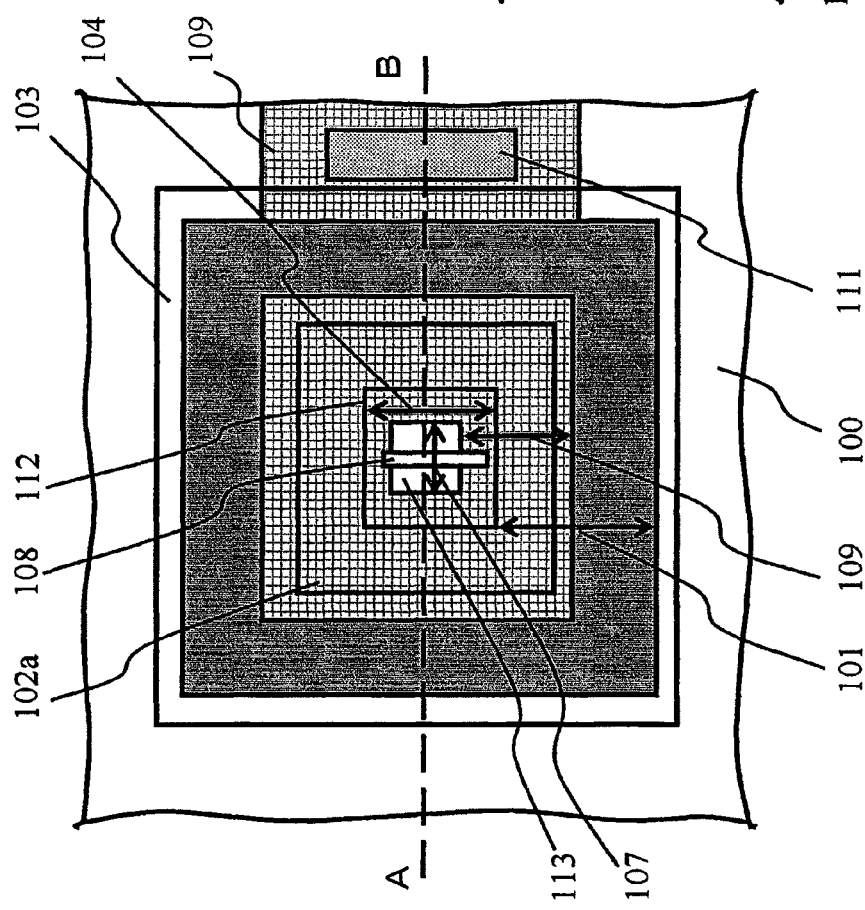
FIG. 9B is a cross-sectional view of the semiconductor device according to Example 3.

FIG. 9A is a plan view showing a semiconductor device according to Example 3, and FIG. 9B is a cross-sectional view of the semiconductor device according to Example 3. FIG. 9A is a plan view showing arrangement of a P-type semiconductor substrate 100, an N-type well region formed of an N-type impurity region 101 having a large doping depth and an N-type impurity region 103 having a small doping depth, a P-type well region 102a forming a triple well structure, a P-type well region 102b, a penetrating region 104, shallow trench isolation (STI) 109, well tap 111, a boundary 112 of the penetrating region, and a MOS transistor 113. In addition, FIG. 9A also shows that a field region 107 defining the MOS transistor 113 inside the penetrating region 104, a gate electrode 108 of the MOS transistor 113, the MOS transistor 113, and the STI 109 performing electrical insulation of the well tap 111 are formed. In addition, the above N-type well region is formed in the P-type semiconductor substrate 100. The P-type well region 102a is formed inside the N-type well region, that is, is surrounded by the N-type well region. The penetrating region 104 is disposed inside the P-type well region 102a and functions to electrically connect the P-type well region 102a to the P-type semiconductor substrate 100. The penetrating region 104 penetrating the N-type well region is approximately as large as the MOS transistor 113. The reason for this is that when the penetrating region 104 is too small, electrical connection between the P-type well region 102a and the P-type semiconductor substrate 100 is disturbed due to a depletion layer of a P-N junction formed of the P-type impurity in the penetrating region 104 and the N-type impurity in the N-type well region. In addition, as another reason, when the penetrating region 104 is too large, an effect of suppressing noises and the like from the P-type semiconductor substrate 100 cannot be obtained.

FIG. 9B is a cross-sectional view of the semiconductor device taken along the dotted line A-B shown in FIG. 9A. As shown in FIG. 9B, the N-type well region is formed from the surface of the P-type semiconductor substrate 100 in the depth direction thereof. The N-type impurity region 103 having a small doping depth is disposed at the top side of the N-type well region, and the N-type impurity region 101 having a large doping depth is disposed at the bottom portion of the N-type well region. In addition, the P-type well region 102a is formed from the surface of the P-type semiconductor substrate 100 in the depth direction thereof. The penetrating region 104 is a penetrating region formed from the bottom portion of the P-type well region 102a to the P-type semiconductor substrate 100 through the N-type well region. The periphery of the penetrating region 104 is the boundary 112 thereof. In addition, the P-type semiconductor substrate 100, the N-type well region, and the P-type well region 102a form a so-called triple well structure. Furthermore, FIG. 9B shows cross-sectional views of the field region 107 defining the MOS transistor 113, the electrode 108 of the MOS transistor 113, the STI 109, and the source and the drain 110 of the MOS transistor 113. FIG. 9B shows that the STI 109 and the well tap 111 are formed in the P-type well region 102b not forming a triple well structure. The boundary 112 of the penetrating region and the MOS transistor 113 are approximately overlapped with each other when viewed in plan. The well tap 111 serves to apply an electrical potential to the P-type well region 102b not forming a triple well structure. In addition, the potential applied from the well tap 111 is also applied to the P-type well region 102a forming a triple well structure through the penetrating region 104.

FIGS. 10A, 10B, 10C, 10D, 11A, 11B, 11C, and 11D are cross-sectional views of the semiconductor device shown in FIGS. 9A and 9B in process for schematically illustrating steps of a manufacturing method thereof.

FIGS. 10A, 10B, 10C, 10D, 11A, 11B, 11C, and 11D show a semiconductor substrate 114, an N-type impurity region 115 having a large doping depth, a resist opening pattern 116, STI 117, a resist opening pattern 118, an N-type impurity region 119 having a small doping depth, a polycrystalline silicon layer and a gate oxide film 120, a resist pattern 121, a gate electrode 122 of a MOS transistor, a source and a drain 123 of the MOS transistor, a penetrating region 124, a P-type well region 125a forming a triple well structure, a P-type well region 125b not forming a triple well structure, a resist pattern 126, a well tap 127, and a region 49 to be enlarged.

FIG. 10A shows that the STI 117 is formed for element isolation. The STI 117 is formed as described below. First, grooves of approximately 0.5 µm are formed in the semiconductor substrate 114. Next, the surface of the semiconductor substrate 114 is oxidized. An insulating layer is then deposited on the semiconductor substrate 114 so as to fill the grooves with an insulating material. Subsequently, the insulating layer provided on the substrate other than that provided in the grooves is removed by chemical mechanical polishing (CMP), so that the STI 117 is obtained.

FIG. 10B shows that the penetrating region 124 and the N-type impurity region 115 are formed by the steps of applying a resist onto the semiconductor substrate 114, performing a photolithographic process to form the resist opening pattern 116, and then performing ion implantation. The resist opening pattern 116 is formed to have an opening which corresponds to the N-type impurity region 115 having a large doping depth. That is, the resist opening pattern 116 has not a resist pattern over a place at which the N-type well region is to be formed but has a resist pattern at a place corresponding to the penetrating region 124. Hence, the penetrating region 124 is formed by inhibiting the impurity implantation using the above pattern.

Although the above ion implantation method will be described later with reference to FIGS. 12A to 12D or FIGS. 13A to 13D, which relate to the region 49, briefly speaking, the method is that while the opening of the resist opening pattern 116 is gradually increased or decreased, a plurality of ion implantation steps is performed. That is, in order to increase or decrease the area on the surface of the semiconductor substrate in which ion implantation is to be performed, when ion implantation is performed while the position of the end portion of the mask for ion implantation is changed, the N-type impurity region 115 having a large doping depth can be formed.

In addition, even when the resist opening pattern 116 has no resist pattern portion covering the penetrating region 124, the penetrating region 124 can be formed. In this case, the penetrating region 124 is formed as described below. First, the N-type impurity is ion-implanted in a region in which the N-type impurity region 115 is to be formed. In this case, in a region in which the penetrating region 124 is to be formed, the N-type impurity is implanted. Hence, a resist is again applied, followed by performing a photolithographic step, so as to form a resist pattern having an opening corresponding to the penetrating region 124, and then a P-type impurity compensating for the N-type impurity is implanted. As a result, since the P-type impurity is implanted in the N-type impurity region 115 for compensation, the penetrating region 124 is formed. In addition, when the P-type impurity is implanted in order to compensate for the N-type impurity, it is needless to say that implantation of the P-type impurity is performed a plurality of times while the opening of the resist pattern is gradually increased or decreased.

FIG. 10C shows the N-well region which is formed by forming the N-type impurity region 119 having a small doping region. In order to form the N-type impurity region 119, first, after a resist is applied, a photolithographic step is performed to form the resist opening pattern 118 so as to be overlapped with the N-type impurity region 115 having a large doping region when viewed in plan. Next, by ion implantation, the N-type impurity region 119 is formed. As a result, the N-type impurity region 115 and the N-type impurity region 119 are connected to each other, so that the N-type well region is formed. In addition, the P-type well region surrounded by the N-type well region is also formed.

FIG. 10D is a view showing the P-type well region 125a forming a triple well structure and the P-type well region 125b not forming a triple well structure. In order to form the P-type well regions 125a and 125b, first, the resist pattern 126 covering the N-type impurity region 119 is formed by applying a resist, followed by a photolithographic step. Next, by using the resist pattern 126 as a mask, a P-type impurity is implanted. Subsequently, the resist pattern 126 is removed.

Figure 11A:
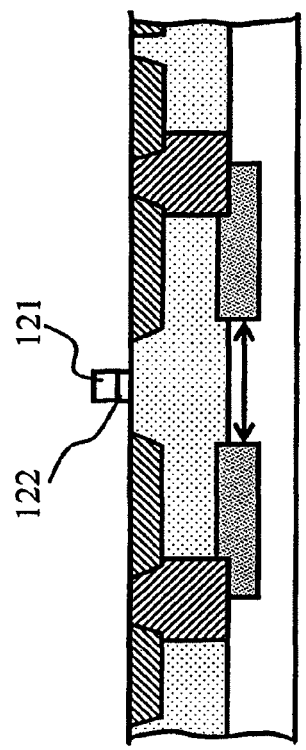
FIGS. 11A to 11D are cross-sectional views for illustrating a second half of the process of the method for manufacturing a semiconductor device, according to Example 3.

FIG. 11A shows the resist pattern 121 used for forming the gate electrode 122 of the MOS transistor. Before forming the resist pattern 121, the resist pattern 126 is removed, and gate oxidation is then performed, followed by deposition of a polycrystalline silicon layer, so that the polycrystalline silicon layer and the gate oxide film 120 are formed. Next, a resist is applied, followed by a photolithographic step, so that the resist pattern 121 is formed which is used for forming the gate electrode 122 of the MOS transistor.

Figure 11B:
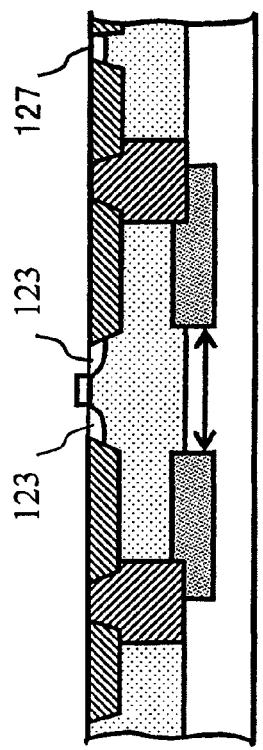

FIG. 11B shows the state in which the gate electrode 122 of the MOS transistor is formed. The gate electrode 122 of the MOS transistor is formed by etching the polycrystalline silicon layer and the gate oxide film 120 using the resist pattern 121 as a mask.

Figure 11C:
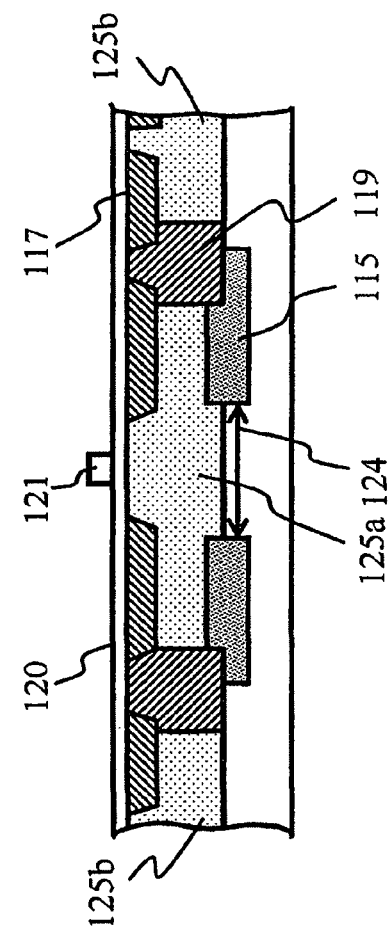

FIG. 11C shows the state in which the source and the drain 123 of the MOS transistor are formed. In order to form the source and the drain 123, first, a resist is applied, followed by a photolithographic step, so that a resist pattern is formed for forming the source and the drain 123. Next, an impurity for forming the source and the drain 123 is ion-implanted by using the above resist pattern as a mask. Subsequently, the resist pattern is removed, and heat treatment is then performed so as to activate the impurity of the source and the drain 123, thereby forming the source and the drain regions.

Figure 11D:
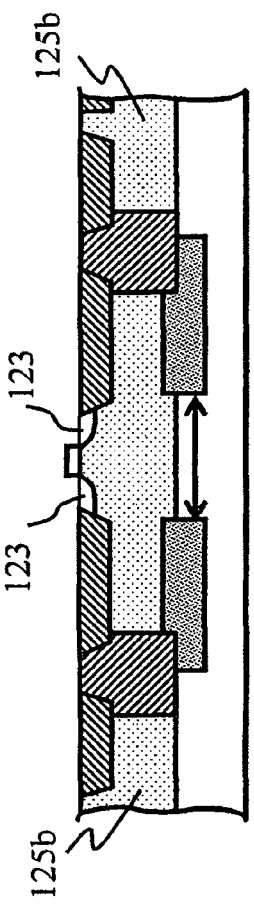

FIG. 11D shows the state in which the well tap 127 of the MOS transistor is formed. In order to form the well tap 127, first, a resist is applied, followed by a photolithographic step, so that a resist pattern is formed for forming the well tap 127. Next, an impurity for forming the well tap 127 is ion-implanted by using the above resist pattern as a mask. Subsequently, the resist pattern is removed, and heat treatment is then performed so as to activate the impurity of the well tap 127, thereby forming the region thereof.

FIGS. 12A, 12B, 12C, and 12D are views for illustrating one of methods for performing ion implantation of an N-type impurity, according to Example 3.

FIGS. 12A, 12B, 12C, and 12D show a semiconductor substrate 132, an N-type well region 131 having a large doping depth, a penetrating region 135, STI 130, a resist pattern 133, a dotted line 134 indicating a region to be enlarged, ion implantation 136, a resist pattern 137 used for first ion implantation, an N-type well region 138 having a large doping depth formed by the first ion implantation, a resist pattern 139 used for second ion implantation, an N-type well region 140 having a large doping depth formed by the second ion implantation, a resist pattern 141 used for third ion implantation, and an N-type well region 142 having a large doping depth formed by the third ion implantation.

FIG. 12A is a cross-sectional view of a semiconductor device and shows that in order to form the N-type well region 131 having a large doping depth, the resist pattern 133 is formed by applying a resist on the surface of the semiconductor substrate 132 in which the STI 130 is formed beforehand, followed by a photolithographic step. The resist pattern 133 is used for forming the N-type well region 131 and the penetrating region 135 by ion implantation of an N-type impurity in the semiconductor substrate 132 in a direction along the normal line to the surface thereof. Next, FIGS. 12B, 12C and 12D are enlarged views of the region indicated by the dotted line 134 shown in FIG. 12A and are cross-sectional views of the semiconductor device. FIG. 12B shows the N-type well region 138 formed by the first ion implantation of an impurity using the resist pattern 137 as a mask. FIG. 12C shows the N-type well region 140 formed by the second ion implantation of an impurity using the resist pattern 139 as a mask having an opening larger than that of the resist pattern 137. FIG. 12D shows the N-type well region 142 formed by the third ion implantation of an impurity using the resist pattern 141 as a mask having an opening larger than that of the resist pattern 139.

That is, in order to increase the area on the surface of the semiconductor substrate in which ion implantation is to be performed, the ion implantation steps are performed while the position of the end portion of the resist mask pattern is changed, so that the N-type well region 131 having a large doping depth is composed of the N-type well regions 138, 140, and 142 formed by the first, the second, and the third ion implantation, respectively, each having a large doping depth.

When the above process is described in a general manner, the N-type well region 131 having a large doping depth is formed by performing ion implantation n times. Accordingly, when the impurity concentration of the N-type well region 131 is obtained by a predetermined amount of the impurity, and when the amount of implanted impurity is equally divided by the number n, the amount of the impurity implanted by one ion implantation is 1/n of the predetermined amount of the impurity. That is, the phenomena observed on the surface of the semiconductor substrate at the boundary area of the penetrating region 135, shown in FIGS. 8B and 8C, occurs n times at different positions. Since the position is changed at which the ion implantation of the N-type impurity is performed, the peak impurity concentration of the N-type impurity is decreased. Alternatively, the amount of implanted impurity may not be equally divided by the number n as long as the total of the implanted impurity reaches the predetermined amount. In addition, the amount of change in position of the end portion of the resist mask pattern shown in FIG. 12C is preferably equivalent to that shown in FIG. 12D. The reason for this is that when the amount of change in position of the end portion of the resist mask pattern is different between implantation steps, although the amount of implanted impurity is equally divided by the number of implantation steps, the distribution of the impurity may be deviated in some cases.

FIGS. 13A, 13B, 13C, and 13D are views for illustrating another method for performing ion implantation of an N-type impurity, according to Example 3.

FIGS. 13A, 13B, 13C, and 13D show a semiconductor substrate 148, an N-type well region 146 having a large doping depth, a penetrating region 147, STI 145, a resist pattern 149, a dotted line 150 indicating a region to be enlarged, ion implantation 151, a resist pattern 152 used for first ion implantation, an N-type well region 153 having a large doping depth formed by the first ion implantation, a resist pattern 154 used for second ion implantation, an N-type well region 155 having a large doping depth formed by the second ion implantation, a resist pattern 156 used for third ion implantation, and an N-type well region 157 having a large doping depth formed by the third ion implantation. FIG. 13A is a cross-sectional view of a semiconductor device and shows the state in which in order to form the N-type well region 146 having a large doping depth, the resist pattern 149 is formed by applying a resist on the surface of the semiconductor substrate 148 in which the STI 145 is formed beforehand, followed by a photolithographic step. The resist pattern 149 is used for forming the N-type well region 146 and the penetrating region 147 by ion implantation of an N-type impurity in the semiconductor substrate 148 in a direction along the normal line to the surface thereof.

Next, FIGS. 13B, 13C and 13D show enlarged views of the region indicated by the dotted line 150 shown in FIG. 13A and are cross-sectional views of the semiconductor device. FIG. 13B shows the state in which the N-type well region 153 having a large doping depth is formed by the first ion implantation 151 of an impurity using the resist pattern 152 as a mask. FIG. 13C shows the state in which the N-type well region 155 having a large doping depth is formed by the second ion implantation 151 of an impurity using the resist pattern 154 as a mask having an opening smaller than that of the resist pattern 152. FIG. 13D shows the state in which the N-type well region 157 having a large doping depth is formed by the third ion implantation 151 of an impurity using the resist pattern 156 as a mask having an opening smaller than that of the resist pattern 154.

That is, in order to decrease the area on the surface of the semiconductor substrate in which ion implantation is to be performed, the ion implantation is performed while the position of the end portion of the resist mask pattern is changed, so that the N-type well region 146 having a large doping depth and the penetrating region 147 are formed by performing ion implantation three times. When the above process is described in a general manner, the N-type well region 146 having a large doping depth and the penetrating region 147 are formed by performing ion implantation n times. Accordingly, when the impurity concentration of the N-type well region 146 having a large doping depth is obtained by a predetermined amount of the impurity, and when the amount of implanted impurity is equally divided by the number n, the amount of the impurity implanted by one ion implantation is 1/n of the predetermined amount of the impurity. That is, the phenomena observed on the surface of the semiconductor substrate at the boundary area of the penetrating region 147, shown in FIGS. 8B and 8C, occurs n times at different positions. Since the position is changed at which the ion implantation of the N-type impurity is performed, the peak impurity concentration of the N-type impurity is decreased. Alternatively, the amount of implanted impurity may not be equally divided by the number n as long as the total of the implanted impurity reaches the predetermined amount. In addition, the amount of change in position of the end portion of the resist mask pattern shown in FIG. 13C is preferably equivalent to that shown in FIG. 13D. The reason for this is that when the amount of change in position of the end portion of the resist mask pattern is different between implantation steps, although the amount of implanted impurity is equally divided by the number of implantation steps, the distribution of the impurity may be deviated in some cases.

For example, as shown in FIGS. 4A and 4B, when the N-type well region having a large doping depth is formed by three ion implantation steps in each of which the same species and same amount of impurity are used, the peak value of the impurity concentration is $5.5 \times 10^{16}/cm^3$ as shown by the solid line 46. On the other hand, when the N-type well region having a large doping depth is formed only by one ion implantation step, the peak value of the impurity concentration is $8.5 \times 10^{16}/cm^3$ as shown by the chain line 45. Accordingly, when the N-type well region having a large doping depth is formed by three ion implantation steps, the peak value of the impurity concentration can be decreased.

As a result, by ion implantation for forming the N-type well region having a large doping depth, implantation of an N-type impurity in the P-type well region which forms the triple well shown in FIGS. 9A and 9B can be suppressed. Accordingly, the counteraction of the function of the P-type impurity in the above P-type well region by the N-type impurity can be suppressed. That is, since the concentration of the P-type impurity in the P-type well region is approximately constant, even when a MOS transistor formed in the P-type well region is disposed so as to be overlapped with the boundary area of the penetrating region, adverse influence on properties of the MOS transistor can be reduced.

The methods for manufacturing a semiconductor device shown in FIGS. 9A and 9B, according to Example 3, that is, the manufacturing methods shown in FIGS. 10A to 10D, 11A to 11D, 12A to 12D, and 13A to 13D each include the steps of forming the N-type well region having a small doping depth from the surface of the semiconductor substrate, which has a P-type conductivity as a whole, in the depth direction thereof and forming the N-type well region having a large doping depth and the P-type penetrating region at the bottom portion of the impurity region having a small doping depth. In other words, the manufacturing methods described above each include a step of performing ion implantation a plurality of times while the end portion of the resist pattern used as a mask for ion implantation is changed in order to increase or decrease the area on the surface of the semiconductor substrate in which ion implantation is to be performed, and a step of forming the P-type well region from the surface of the P-type semiconductor substrate in the depth direction thereof and in the N-type well region. In addition, according to the manufacturing method of Example 3, the penetrating region is formed to penetrate the N-type well region, and hence the P-type semiconductor substrate and the P-type well region are electrically connected to each other at the bottom thereof. Furthermore, in the semiconductor device manufactured by the manufacturing method of Example 3, the MOS transistor and the boundary area of the penetrating region are overlapped with each other. In this example, the penetrating region may not be simultaneously formed when the N-type well region having a large doping depth is formed. That is, after the N-type well region having a large doping depth is formed, while the position of the end portion of the resist pattern used for ion implantation is changed, the penetrating region can be formed by performing ion implantation of a P-type impurity a plurality of times in a region in which the penetrating region is to be formed.

Accordingly, when a semiconductor device is manufactured by the manufacturing method of Example 3, an adverse influence of an impurity present at the boundary of the penetrating region on properties of the MOS transistor can be suppressed, and hence the MOS transistor can be stably operated. For example, adverse influence on leakage properties between a source terminal and a drain terminal and the like caused by the N-type impurity present at the boundary of the penetrating region may be effectively suppressed.

In addition, the penetrating region located at the bottom portion of the P-type well region and penetrating the N-type well region is approximately as large as the MOS transistor. In addition, the penetrating region is disposed under the MOS transistor. Hence, the penetrating region is not closed by enlargement of the depletion layer caused by the P-N junction, and hence supply of electricity becomes stable. Furthermore, by the stable supply of electricity, the properties of the transistor on the P-type well region become stable.

Furthermore, since the boundary area of the penetrating region can be formed under the transistor, that is, the transistor and the penetrating region or the boundary area thereof can be overlapped with each other when viewed in plan, compared to the case in which the penetrating region is independently formed, the size of the P-type well region can be easily decreased.

In addition, in Example 3 described above, it is described that the MOS transistor is formed in the P-type well region forming a triple well structure, and that adverse influence of the boundary area of the penetrating region on the properties of the MOS transistor can be suppressed. On the other hand, the boundary area of the penetrating region of the semiconductor device shown in FIGS. 8A and 8B may adversely influence in some cases the operation of a transistor such as a bipolar transistor besides a MOS transistor. The reason for this is that decrease in withstand voltage of the P-N junction at the boundary area of the penetrating region, which is caused by the N-type impurity, may also degrade properties, such as leakage properties between terminals, of a bipolar transistor and the like. Hence, of course, the manufacturing method of a semiconductor device according to Example 3 can effectively suppress the degradation of the leakage properties of other transistors besides a MOS transistor.

EXAMPLE 4

With reference to FIGS. 14A to 14E and 15A to 15E, Example 4 will be described. Example 4 is an example of a method for manufacturing a semiconductor device by performing the ion implantation shown in FIG. 13B a plurality of times.

FIGS. 14A, 14B, 14C, 14D, and 14E show a method in which ion implantation is performed a plurality of times while resist patterns having openings which are gradually decreased are overlapped so as to decrease an opening of a resist pattern used for ion implantation. In addition, FIGS. 14A to 14E show ion implantation 166, resist patterns 167, 172, 175, resists 171 and 174, STI 168, a semiconductor substrate 169, and N-type impurity regions 170, 173, and 176, each having a large doping depth.

FIG. 14A shows the STI 168 formed in the semiconductor substrate 169 and the resist pattern 167 formed on the surface thereof. In addition, FIG. 14A also shows that the N-type impurity region 170 having a large doping depth is then formed by the first ion implantation 166.

FIG. 14B shows that after the step shown in FIG. 14A, the resist 171 is applied.

FIG. 14C shows that after the step shown in FIG. 14B, the resist pattern 172 having an opening smaller than that of the resist pattern 167 is formed by a photolithographic step. In addition, FIG. 14C shows that the N-type impurity region 173 having a large doping depth is then further formed by the second ion implantation 166.

FIG. 14D shows that after the step shown in FIG. 14C, the resist 174 is applied.

FIG. 14E shows that after the step shown in FIG. 14D, the resist pattern 175 having an opening smaller than that of the resist pattern 172 is formed by a photolithographic step. In addition, FIG. 14E shows that the N-type impurity region 176 having a large doping depth is then further formed by the third ion implantation 166. Subsequently, the resist patterns 167, 172, and 175 are simultaneously removed, so that the ion implantation is complete. Accordingly, in order to decrease the area on the surface of the semiconductor substrate in which ion implantation is to be performed, ion implantation is performed a plurality of times while the position of the end portion of the resist mask pattern for ion implantation is changed, and hence the N-type impurity regions 170, 173, and 176 each having a large doping depth are formed.

According to the ion implantation shown in FIGS. 14A to 14E in which the ion implantation is performed a plurality of times while the opening of the resist pattern for ion implantation is gradually decreased, the resist patterns 167, 172, and 175 are not necessarily removed after the respective ion implantation steps, and after all the ion implantation steps are finished, the resist patterns 167, 172, and 175 may be simultaneously removed. Hence, when the ion implantation is performed a plurality of times, the number of manufacturing steps can be reduced. In the case described above, the reduction in opening of the resist pattern for ion implantation is preferably set constant. Otherwise, even when the total amount of impurity is equally divided by the number of ion implantation steps, the impurity distribution may be deviated in some cases.

FIGS. 15A, 15B, 15C, 15D, and 15E show an ion implantation method in which ion implantation is performed while an opening of a pattern made of a silicon oxide film ($SiO_2$) layer (in description in FIGS. 15A, 15B, 15C, 15D, and 15E, hereinafter simply referred to as "oxide film layer") for masking the ion implantation is gradually decreased by forming a sidewall spacer made of an oxide film layer on the side surface portion of the above pattern. In addition, FIGS. 15A to 15E show ion implantation 177, a pattern 178 made of an oxide film layer, sidewall spacers 183 and 186 made of an oxide film layer, oxide film layers 182 and 185, STI 179, a semiconductor substrate 180, and N-type impurity regions 181, 184, and 187 each having a large doping depth.

FIG. 15A shows the STI 179 formed in the semiconductor substrate 180 and the pattern 178 formed on the surface thereof. In addition, FIG. 15A also shows that the N-type impurity region 181 having a large doping depth is then formed by the first ion implantation 177. In the process described above, the pattern 178 made of an oxide film layer is formed by the steps of applying a resist, forming a resist pattern by a photolithographic step, and performing etching using the resist pattern as a mask.

FIG. 15B shows that after the step shown in FIG. 15A, the oxide film layer 182 is formed.

FIG. 15C shows that after the step shown in FIG. 15B, the sidewall spacer 183 made of an oxide film layer is formed by an anisotropic etching step. In addition, FIG. 15C shows that after the above step, the N-type impurity region 184 having a large doping depth is then further formed by the second ion implantation 177.

FIG. 15D shows that after the step shown in FIG. 15C, the oxide film layer 185 is formed.

FIG. 15E shows that after the step shown in FIG. 15D, the sidewall spacer 186 made of an oxide film layer is formed inside the sidewall spacer 183 by an anisotropic etching step. In addition, FIG. 15E shows that the N-type impurity region 187 having a large doping depth is then further formed by the third ion implantation 177. Subsequently, the pattern 178 and the sidewall spacers 183 and 186, each of which is made of an oxide film layer, are simultaneously removed, so that the ion implantation is complete. Accordingly, in order to decrease the area on the surface of the semiconductor substrate in which ion implantation is to be performed, ion implantation is performed a plurality of times while the position of the end portion of the mask pattern made of an oxide film layer for ion implantation is changed, and hence the N-type impurity regions 181, 184, and 187 each having a large doping depth are formed.

According to the method shown in FIGS. 15A to 15E in which the ion implantation is performed a plurality of times while the opening of the pattern made of an oxide film layer for masking ion implantation is gradually decreased, the pattern 178 and the sidewall spacers 183 and 186, each of which is made of an oxide film layer, are not necessarily removed after the respective ion implantation steps, and after all the ion implantation steps are finished, the pattern 178 and the sidewall spacers 183 and 186 can be simultaneously removed. Hence, when the ion implantation is performed a plurality of times, the number of the manufacturing steps can be reduced. In addition, the region in which ion implantation is to be performed can be determined in a self-alignment manner with respect to the opening of the pattern 178 made of an oxide film layer. As a result, since the boundary areas of the regions in which the ion implantation steps are to be performed are reliably located at different positions from each other, when the N-type well region having a large doping depth is formed by performing ion implantation a plurality of times, the effect of decreasing the peak value of the impurity concentration can be reliably obtained. In addition, the width of the sidewall spacer shown in FIG. 15C is preferably equivalent to that shown in FIG. 15E. Otherwise, even when the total amount of impurity is equally divided by the number of the ion implantation steps, the impurity distribution may be deviated in some cases.

Incidentally, in FIGS. 15A to 15E, the mask and the sidewall spacers for ion implantation are formed of a silicon oxide; however, when silicon nitride ($SiN_2$) or silicon oxynitride (SiON) is used, the result equivalent to that described above may also be obtained.

EXAMPLE 5

Example 5 will be described with reference to FIG. 16. Example 5 is an example in which a semiconductor device having an SRAM(Static Random Access Memory) cell formed of MOS transistors is manufactured by the manufacturing method of Example 3 or 4.

Figure 16:
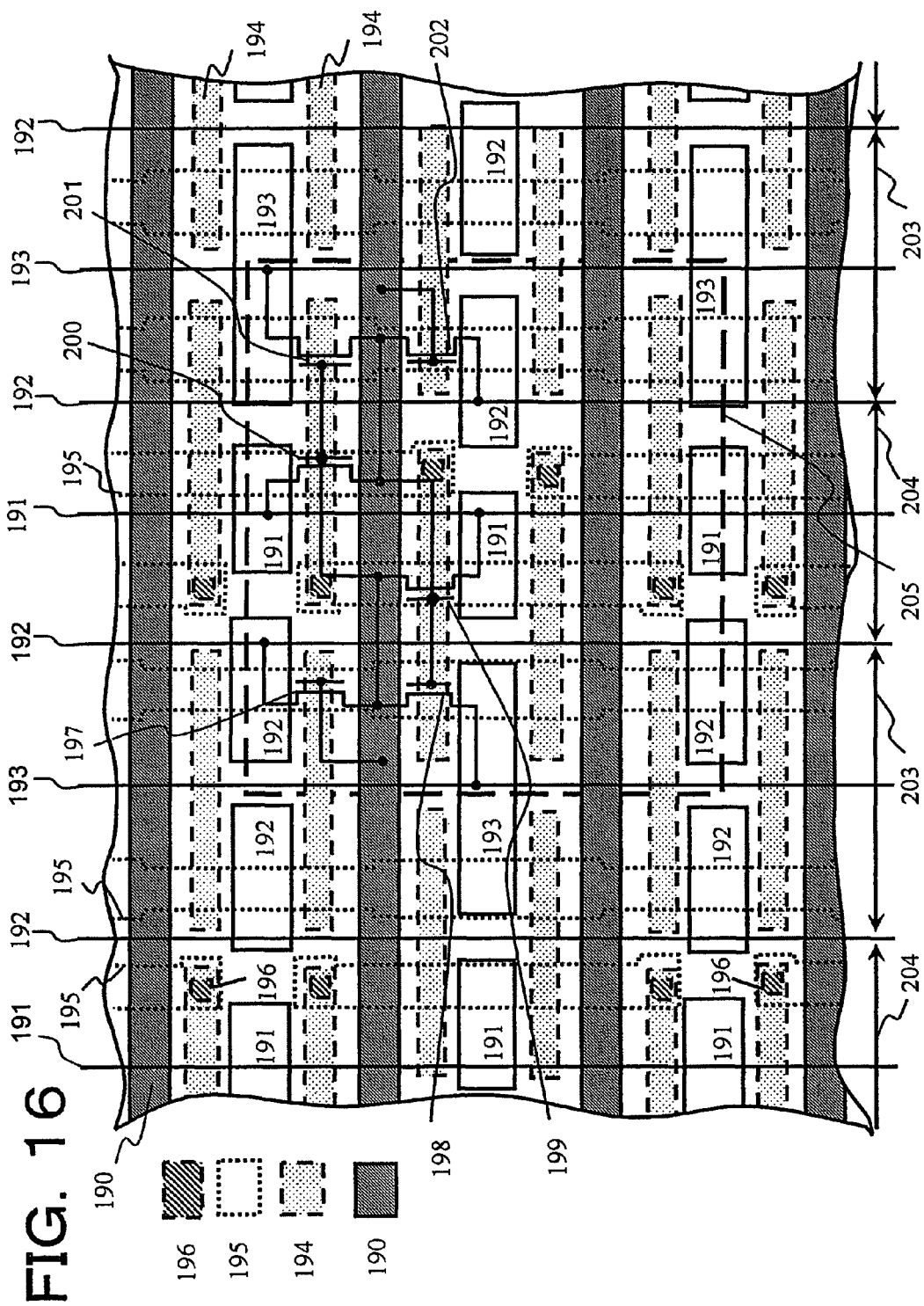
FIG. 16 is a view for illustrating Example 5 in which the method for manufacturing a semiconductor device, according to Example 1, is applied to a semiconductor device having SRAM(Static Random Access Memory) cells.

FIG. 16 is a plan view for illustrating a layout of an SRAM cell of the semiconductor device of Example 5. In FIG. 16, there are shown word lines 190, VDD lines 191, bit lines 192, GND lines 193, gate electrodes 194 of MOS transistors, field regions 195, contacts 196, an N-type MOS transistor 197, an N-type MOS transistor 198, a P-type MOS transistor 199, a P-type MOS transistor 200, an N-type MOS transistor 201, an N-type MOS transistor 202, P-type well regions 203, N-type well regions 204, and a boundary portion 205 of a penetrating region.

When the predetermined field regions 195 and the predetermined gate electrodes 194 of the MOS transistors are disposed in accordance with a predetermined regularity, the MOS transistors may be compactly arranged in a matrix in accordance with a predetermined regularity.

That is, except for the place at which the contact is disposed, a channel of the MOS transistor is formed at an intersection portion between the field region 195 and the gate electrode 194 of the MOS transistor. In addition, at an intersection portion between the field region 195 and the gate electrode 194 and at which the contact 196 is disposed, the field region 195 and the gate electrode 194 are electrically connected to each other.

In addition, of the MOS transistors arranged in a matrix, for example, the P-type MOS transistors 199 and 200 in the N-type well region 204 and the N-type MOS transistors 197, 198, 201, and 202 in the P-type well regions 203 are connected to each other with wire layers shown by heavy lines in FIG. 16, so that the SRAM cell can be formed. That is, by the connection described above, the N-type MOS transistor 198 and the P-type MOS transistor 199 form an inverter circuit. In addition, the N-type MOS transistor 201 and the P-type MOS transistor 200 form an inverter circuit. The two inverter circuits are cross-connected to each other. Furthermore, the N-type MOS transistor 197 and the N-type MOS transistor 202 each form a transfer gate of the SRAM cell.

The N-type well region 204 and the P-type well region 203 are rectangular regions having a long side in the column direction in plan and are alternately disposed in plan. In this case, for example, the width of the N-type well region 204 is approximately 0.5 µm. In addition, for example, the width of the P-type well region 203 is approximately 0.7 µm. Hence, the N-type well regions 204 are separated by the P-type well region 203 when viewed in plan. However, since the P-type well region 203 is formed in the N-type well regions 204, the N-type well regions 204 are connected to each other with an N-type impurity region having a large doping depth which is provided at the bottom portion of the P-type well region 203. That is, the N-type well regions 204 are regions surrounding the entire SRAM cell matrix containing the SRAM cells.

In FIG. 16, the boundary portion 205 of the penetrating region is formed, for example, so as to surround two SRAM cells. That is, compared to the N-type well region 204 surrounding the entire SRAM cell matrix, the penetrating region is very small. In addition, the boundary portion 205 of the penetrating region has a rectangular shape. The formation of the penetrating region and that of the impurity region of an N-type impurity having a large doping depth of the N-type well region 204 are performed by the same ion implantation step. As the ion implantation method used in the above ion implantation step, one of the ion implantation methods shown in FIGS. 12A to 12D, 13A to 13D, 14A to 14E, and 15A to 15E is used. Hence, as shown by the solid line 46 shown in FIGS. 4A and 4B, the peak value of the N-type impurity concentration in the boundary portion 205 of the penetrating region can be decreased. As a result, since influence of the boundary portion 205 of the penetrating region on the MOS transistors forming the SRAM cell can be suppressed, the boundary portion 205 of the penetrating region may be overlapped with the SRAM cell when viewed in plan.

In addition, the pattern of the field regions 195 of Example 5 includes continuous bar-shaped patterns, each of which continuously extends in the column direction and each width of which is periodically changed, and short bar-shaped patterns. As the regular disposition of the field regions 195, an arrangement A in which the continuous bar-shaped pattern is disposed in the column direction, an arrangement B in which the short bar-shaped patterns are disposed in the column direction, and an arrangement C in which the short bar-shaped patterns are disposed in the column direction are repeatedly disposed in the column direction, the short bar-shaped patterns of the arrangement B and the short bar-shaped patterns of the arrangement C being disposed in a staggered manner. In addition, the pattern of the gate electrode 194 of the MOS transistor of Example 5 is a long bar-shaped pattern having a length so as to intersect two lines of the field regions 195. In addition, as the regular disposition of the gate electrodes, the long bar-shaped pattern is disposed in the row direction so as to intersect two field regions 195.

The VDD lines 191 are each shown by a heavy line and a rectangular wire layer pattern and function to transmit a power source voltage at a high voltage side to the SRAM cell. The rectangular wire layer patterns are patterns which are connected to the field regions 195 and are connected to the sources of the P-type MOS transistors 199 and 200 forming the SRAM cell. The heavy line of the VDD line 191 is formed of a wire layer and connects the rectangular patterns in the column direction of the matrix. The bit lines 192 are each shown by a heavy line and a rectangular wire layer pattern and function to transmit a bit line signal to the SRAM cell. The rectangular patterns are wire layer patterns which are connected to the field regions 195 and are connected to the N-type MOS transistors 197 and 202 forming the SRAM cell. The heavy line of the bit line 192 is formed of a wire layer and connects the rectangular patterns in the column direction of the matrix.

The GND lines 193 are each shown by a heavy line and a rectangular wire layer pattern as is the case described above, and function to transmit a power source voltage at a low voltage side to the SRAM cell. The rectangular wire layer patterns are patterns which are connected to the field regions 195 and are connected to the drains of the N-type MOS transistors 198 and 201 forming the SRAM cell. The heavy line of the GND line 193 is formed of a wire connecting the rectangular patterns in the column direction of the matrix.

The word line 190 is formed of a wire layer connected to the gate electrodes 194 of the M-type MOS transistors 197 and 202. In addition, the word line 190 functions to transmit a selection signal for incorporating a bit line signal to a memory portion of the SRAM cell.

As shown in Example 5, when a semiconductor device having SRAM cells is formed by the manufacturing method of Example 3 or 4, the boundary portion of the penetrating region and the SRAM cell can be overlapped with each other. The reason for this is that the peak value of the N-type impurity concentration at the boundary portion of the penetrating region can be suppressed. As a result, it is not necessary to intentionally dispose the penetrating region at a place at which the SRAM cell is not provided, and hence the area of the P-type well region in which the SRAM cell is disposed can be decreased.

The features of the present invention will be described below.

The present invention provides a method for manufacturing a semiconductor device, which is capable of decreasing the concentration of an impurity present in the vicinity of the surface of a semiconductor substrate, the impurity being processed by high-energy ion implantation and passing through a resist mask since an end portion thereof has an inclined shape.

According to the present invention, owing to a noise blocking effect of a first well region, a transistor in a second well region is not electrically influenced from the semiconductor substrate and, in addition, is not influenced by the impurity which stays at a boundary portion of a penetrating region for supplying electricity to the second well region. Hence, as a result, there can be provided an effective method for manufacturing a semiconductor device having stable transistor properties.

What is claimed is:

1. A method for manufacturing a semiconductor device, comprising:
   preparing a semiconductor substrate having a first conductive type;
   implanting a first impurity having the first conductive type in the semiconductor substrate to form a well region having a bottom portion; and
   implanting a second impurity having a second conductive type in the semiconductor substrate to form an impurity region having a top portion, the top of the impurity region being in contact with the bottom portion of the well region,
   wherein implanting the second impurity, including
   a first step of implanting the second impurity and
   a second step of implanting the second impurity,
   wherein a first implantation area of the first step of implanting the second impurity being broader or narrower than a second implantation area of the second step of implanting the second impurity.

* * * * *